United States Patent
Abe et al.

(10) Patent No.: US 11,916,089 B2
(45) Date of Patent: Feb. 27, 2024

(54) SOLID-STATE IMAGE PICKUP DEVICE AND IMAGE PICKUP APPARATUS

(71) Applicant: SONY GROUP CORPORATION, Tokyo (JP)

(72) Inventors: Takashi Abe, Kanagawa (JP); Ikuhiro Yamamura, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 39 days.

(21) Appl. No.: 17/483,291

(22) Filed: Sep. 23, 2021

(65) Prior Publication Data
US 2022/0013558 A1 Jan. 13, 2022

Related U.S. Application Data

(63) Continuation of application No. 16/302,238, filed as application No. PCT/JP2017/013914 on Apr. 3, 2017, now Pat. No. 11,152,405.

(30) Foreign Application Priority Data

May 24, 2016 (JP) .................. 2016-103154

(51) Int. Cl.
*H04N 25/76* (2023.01)
*H01L 27/146* (2006.01)
(Continued)

(52) U.S. Cl.
CPC ...... *H01L 27/14605* (2013.01); *H01L 27/146* (2013.01); *H01L 27/14609* (2013.01);
(Continued)

(58) Field of Classification Search
CPC ............. H01L 27/14603; H01L 27/146; H01L 27/14609; H01L 27/14643;
(Continued)

(56) References Cited

U.S. PATENT DOCUMENTS

| 11,152,405 B2 | 10/2021 | Abe et al. |
| 2010/0182465 A1 | 7/2010 | Okita |

(Continued)

FOREIGN PATENT DOCUMENTS

| CN | 102209206 A | 10/2011 |
| CN | 102857711 | 1/2013 |

(Continued)

OTHER PUBLICATIONS

International Search Report and Written Opinion for International (PCT) Patent Application No. PCT/JP2017/013914, dated Jun. 13, 2017, 7 pages.

(Continued)

*Primary Examiner* — Selim U Ahmed
(74) *Attorney, Agent, or Firm* — SHERIDAN ROSS P.C.

(57) ABSTRACT

A solid-state image pickup device includes a plurality of pixels, a pixel connection section, and a pixel reset section. The plurality of pixels each include a photoelectric conversion section that generates a charge according to irradiated light, a charge holding section that holds the generated charge, and a signal generation section that generates as an image signal a signal according to the held charge. The pixel connection section conducts between charge holding sections of the plurality of pixels and thereby allows each of the charge holding sections of the plurality of pixels to hold the charge that has been generated by the photoelectric conversion section of one pixel of the plurality of pixels. The pixel reset section discharges and resets the charge of the respective charge holding sections of the plurality of pixels when the pixel connection section conducts between the respective charge holding sections of the plurality of pixels.

15 Claims, 15 Drawing Sheets

(51) Int. Cl.
*H01L 27/148* (2006.01)
*H04N 25/40* (2023.01)
*H04N 25/59* (2023.01)

(52) U.S. Cl.
CPC ....... *H01L 27/14812* (2013.01); *H04N 25/40* (2023.01); *H04N 25/59* (2023.01); *H04N 25/76* (2023.01)

(58) Field of Classification Search
CPC ......... H01L 27/14612; H01L 27/14605; H01L 27/14812; H04N 5/341; H04N 5/3559
See application file for complete search history.

(56) References Cited

U.S. PATENT DOCUMENTS

| | | |
|---|---|---|
| 2010/0225795 A1 | 9/2010 | Suzuki et al. |
| 2013/0001403 A1* | 1/2013 | Yamakawa ......... H01L 27/1464 257/E31.093 |
| 2013/0050554 A1 | 2/2013 | Mabuchi |
| 2014/0002702 A1 | 1/2014 | Ikedo et al. |
| 2016/0119566 A1 | 4/2016 | Kususaki |

FOREIGN PATENT DOCUMENTS

| | | |
|---|---|---|
| CN | 104917980 A | 9/2015 |
| CN | 105210363 A | 12/2015 |
| JP | 2010-193437 | 9/2010 |
| JP | 2010-212769 | 9/2010 |
| JP | 2013-033896 | 2/2013 |
| JP | 2013-051576 | 3/2013 |
| JP | 2014-112580 | 6/2014 |
| WO | WO 2016/047474 | 3/2016 |

OTHER PUBLICATIONS

Official Action (with English translation) for Chinese Patent Application No. 201780030726.1, dated Aug. 24, 2020, 24 pages.
Extended European Search Report for European Patent Application No. 21180574.2, dated Aug. 2, 2021, 6 pages.
Official Action for U.S. Appl. No. 16/302,238, dated Sep. 20, 2019, 12 pages.
Official Action for U.S. Appl. No. 16/302,238, dated Apr. 1, 2020, 12 pages.
Official Action for U.S. Appl. No. 16/302,238, dated Sep. 8, 2020, 7 pages.
Notice of Allowance for U.S. Appl. No. 16/302,238, dated Dec. 23, 2020, 9 pages.
Official Action for U.S. Appl. No. 16/302,238, dated Feb. 4, 2021, 9 pages.
Notice of Allowance for U.S. Appl. No. 16/302,238, dated Jun. 24, 2021, 8 pages.
Corrected Notice of Allowance for U.S. Appl. No. 16/302,238, dated Sep. 14, 2021, 2 pages.

* cited by examiner

SOLID-STATE IMAGE PICKUP DEVICE AND IMAGE PICKUP APPARATUS

CROSS REFERENCE TO RELATED APPLICATIONS

This application is a continuation of and claims priority to U.S. patent application Ser. No. 16/302,238, filed Nov. 16, 2018, which is a national stage application under 35 U.S.C. 371 and claims the benefit of PCT Application No. PCT/JP2017/013914 having an international filing date of Apr. 3, 2017, which designated the United States, which PCT application claimed the benefit of Japanese Patent Application No. 2016-103154 filed May 24, 2016, the entire disclosures of each of which are incorporated herein by reference.

TECHNICAL FIELD

The present technology relates to a solid-state image pickup device and an image pickup apparatus, and particularly to, a solid-state image pickup device and image pickup apparatus that switch a conversion efficiency a the time when converting incident light into an image signal.

BACKGROUND

In the past, an image pickup apparatus in which a dynamic range is widened to thereby improve visibility has been used. In a low-light intensity, the image pickup apparatus generates an image signal at a high conversion efficiency and improves a signal-to-noise ratio. Here, the conversion efficiency is a ratio of a chance amount of an image signal voltage to the change amount of a charge generated according to light irradiated on a pixel. By contrast, in a high-light intensity, the conversion efficiency is reduced and the image signal voltage is prevented from being saturated. Through the process, a dynamic range can be widened and the visibility can be improved in an incident light amount in a wide range. As such an image pickup apparatus, for example, a system including a photoelectric conversion section, a charge voltage conversion section that accumulates a charge obtained by the photoelectric conversion section, and a capacity switching switch that adds a capacity to the charge voltage conversion section has been proposed (see, for example, PTL 1).

CITATION LIST

Patent Literature

PTL 1: JP 2014-112580A

SUMMARY

Technical Problem

In the above-described related technique, in the low-light intensity, a charge obtained by the photoelectric conversion section is accumulated in the charge voltage conversion section and the accumulated charge am punt is converted into a voltage signal for output. By contrast, in the high-light intensity, when the charge obtained by the photoelectric conversion section is accumulated in the charge voltage conversion section, the capacity is added to the charge voltage conversion section by using the capacity switching switch. That is, in the high-light intensity, the capacity of the charge voltage conversion section is increased. When the capacity is increased, the change amount of the voltage is reduced to the change amount of the charge accumulated in the charge voltage conversion section. Therefore, the conversion efficiency is reduced and the image signal voltage is prevented from being saturated. However, in the above-described related technique, a charge accumulation section and a control device of the charge accumulation section need to be used in order to switch the conversion efficiency of the image signal. Therefore, there arises a problem that an area of the pixel is increased.

The present technology has been made in view of the circumstances as described above and aims at switching a conversion efficiency of a pixel while preventing an increase in an area of a pixel and enlarging a dynamic range.

Solution to Problem

The present technology has been made in order to solve the above-described problem. According to a first aspect of the present technology, there is provided a solid-state image pickup device including: a plurality of pixels each including a photoelectric conversion section that generates a charge according to irradiated light, a charge holding section that holds the generated charge, and a signal generation section that generates as an image signal a signal according to the held charge; a pixel connection section that conducts between a plurality of the charge holding sections of the plurality of pixels and thereby allows each of the charge holding sections of the plurality of pixels to hold the charge that has been generated by the photoelectric conversion section or one of the plurality or pixels; and a pixel reset section that discharges and resets the charge of the respective charge holding sections of the plurality of pixels when the pixel connection section conducts between the respective charge holding sections of the plurality of pixels. Through the process, an operation such that the charge that has been generated by the photoelectric conversion section of one pixel of the plurality of pixels is held by the respective charge holding sections of the plurality of pixels and the image signal is generated in accordance with the held charge is brought about.

Further, in the first aspect of the present technology, the plurality of pixels each may further include a second charge holding section that holds the generated charge and a holding charge control section that conducts between the charge holding section and the second charge holding section and thereby allows the charge holding section and the second charge holding section to hold the generated charge. Through the process, an operation such that the charge that has been generated by the photoelectric conversion section is held by the charge holding section and the second charge holding section, and the image signal is generated in accordance with the held charge is brought about.

Further, in the first aspect of the present technology, the holding charge control section may conduct between the charge holding section and the second charge holding section and thereby discharge a charge of the second charge holding section when a charge of the charge holding section is discharged by the pixel reset section. Through the process, an operation such that the charge holding section and the second charge holding section are reset is brought about.

Further, in the first aspect of the present technology, the pixel connection section and the pixel reset section each may be configured by a MOS transistor having substantially the same shape. Through the process, an operation such that the pixel connection section and the pixel reset section are configured by the MOS transistor having substantially the same shape is brought about.

Further, in the first aspect of the present technology, the pixel reset section may be connected to the charge holding section of one of the plurality of pixels, and the pixel connection section may be arranged near to other of the plurality of pixels than the one pixel to which the pixel reset section is connected and simultaneously the other pixel and the pixel connection section may be formed to have substantially the same shapes as those of the one pixel to which the pixel reset section is connected and the pixel reset section. Through the process, an operation such that the pixel connection section is arranged near to the pixel, and the pixel connection section and the pixel are formed to have substantially the same shapes as those of the pixel reset section and the pixel to which the pixel reset section is connected is brought about.

Further, in the first aspect of the present technology, the pixel connection section may conduct between the charge holding sections of adjacent pixels among the plurality of pixels. Through the process, an operation such that the charge holding sections of adjacent pixels are connected with the pixel connection section is brought about.

Further, in the first aspect of the present technology, the plurality of pixels each may further include an auxiliary charge holding section that holds the generated charge and the charge holding section may hold the charge that has been held by the auxiliary charge holding section. Through the process, an operation such that the charge that has been generated by the photoelectric conversion section is held by the auxiliary charge holding section and the charge that has been held by the auxiliary charge holding section is held by the charge holding section is brought about.

Further, in the first aspect of the present technology, the plurality of pixels each may include a plurality of the photoelectric conversion sections and the charge holding sections may hold a charge that has been generated by one of the plurality of photoelectric conversion sections. Through the process, an operation such that the charge that has been generated by the plurality of photoelectric conversion sections is held by one charge holding section is brought about.

According to a second aspect of the present technology, there is provided a solid-state image pickup device including: a plurality of pixels each including a photoelectric conversion section that generates a charge according to irradiated light, a charge holding section that holds the generated charge, and a signal generation section that generates as an image signal a signal according to the held charge; a plurality of pixel connection sections that conduct between a plurality of the charge holding sections of two pixels of the plurality of pixels and thereby allow each of the charge holding sections of the two pixels to hold the charge that has been generated by the photoelectric conversion section of one pixel of the two pixels; and a pixel reset section that discharges and resets the charge of the respective charge holding sections of the plurality of pixels when the plurality of pixel connection sections conduct between the respective charge holding sections of the plurality of pixels. Through the process, an operation such that the charge that has been generated by the photoelectric conversion section of one pixel of the plurality of pixels is held by the respective charge holding sections of the plurality of pixels and the image signal is generated in accordance with the held charge is brought about.

According to a third aspect of the present technology, there is provided an image pickup apparatus including: a plurality of pixels each including a photoelectric conversion section that generates a charge according to irradiated light, a charge holding section that holds the generated charge, and a signal generation section that generates as an image signal a signal according to the held charge; a pixel connection section that conducts between a plurality of the charge holding sections of the plurality of pixels and thereby allows each of the charge holding sections of the plurality of pixels to hold the charge that has been generated by the photoelectric conversion section of one pixel of the plurality of pixels; a pixel reset section that discharges and resets the charge of the respective charge holding sections of the plurality of pixels when the pixel connection section conducts between the respective charge holding sections of the plurality of pixels; and a processing circuit that processes the generated image signal. Through the process, an operation such that the charge that has been generated by the photoelectric conversion section of one pixel of the plurality of pixels is held by the respective charge holding sections of the plurality of pixels and the image signal is generated in accordance with the held charge is brought about.

Advantageous Effect of Invention

According to the present technology, an excellent effect that a conversion efficiency of a pixel is switched while preventing an increase in an area of the pixel and a dynamic range is enlarged can be exerted. In addition, advantageous effects disclosed herein are not necessarily limited thereto and may be any advantageous effects disclosed during the present disclosure.

DESCRIPTION OF EMBODIMENTS

Hereinafter, a mode (hereinafter, referred to as an embodiment) for carrying out the present technology will be described. Description will be made in the following order.
1. First Embodiment (an example where charge holding sections of two pixels are connected)
2. Second Embodiment (an example where charge holding sections of three pixels are connected)
3. Third Embodiment (an example where a global shutter system is applied)
4. Fourth Embodiment (an example where a pixel has a plurality of photoelectric conversion sections)

1. First Embodiment

[Configuration of Image Pickup Apparatus]

Figure 1:
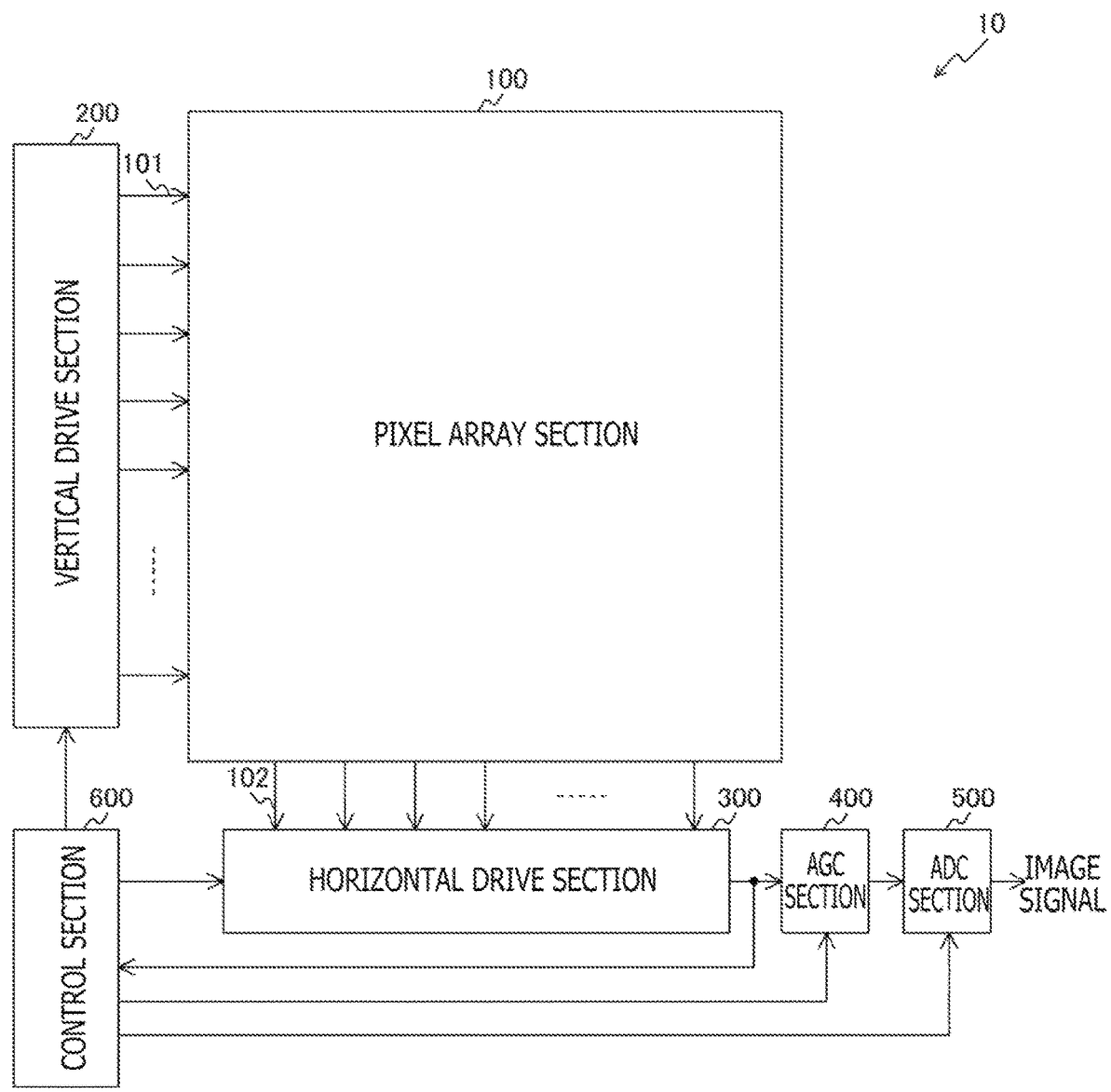
FIG. 1 is a diagram illustrating a configuration example of an image pickup apparatus 10 according to an embodiment of the present technology.

FIG. 1 is a diagram illustrating a configuration example of an image pickup apparatus 10 according to an embodiment of the present technology. The image pickup apparatus 10 includes a pixel array section 100, a vertical drive section 200, a horizontal drive section 300, an automatic gain control (ADC) section 400, an analog-digital conversion (ADC) section 500, and a control section 600.

The pixel array section 100 generates an image signal in accordance with incident light. A pixel having a photoelectric conversion section is arranged in a two-dimensional matrix, and thereby the pixel array section 100 is configured. Further, in the pixel array section 100, a signal line for transferring a control signal to a pixel and a signal line for transferring the image signal generated by the pixel are wired in an X-Y matrix. Details of a configuration of the pixel array section 100 will be described later.

The vertical drive section 200 generates a control signal and outputs the control signal to the pixel array section 100. The vertical drive section 200 includes a shift register and a decoder and generates the control signal in each line of the pixels arranged in the pixel array section 100 for output.

The horizontal drive section 300 processes the image signal generated by the pixel array section 100. Into the horizontal drive section 300, the image signal generated by the pixels arranged in the pixel array section 100 is input in each line. The image signal processed by the horizontal drive section 300 is output to an automatic gain control section 400. Details of a configuration of the horizontal drive section 300 will be described later.

The automatic gain control section 400 amplifies the image signal output from the horizontal drive section 300. At the time of the amplification, the automatic gain control section 400 performs automatic control of gains. The amplified image signal is output to an analog-digital conversion section 500.

The analog-digital conversion section 500 performs an analog-digital conversion. The analog-digital conversion section 500 performs the analog-digital conversion of the image signal output from the automatic gain control section 400 and outputs a digital image signal after the conversion. The image signal output from the analog-digital conversion section 500 forms an output image signal of the image pickup apparatus 10.

The control section 600 controls the entire image pickup apparatus 10. The control section 600 generates a driving signal based on an operation of the vertical drive section 200 etc. and outputs the driving signal to the vert cal drive section 200 etc. to thereby perform the control. In addition, on the basis of the image signal output from the horizontal drive section 300, the control section 600 further performs a change-over of a conversion efficiency in the pixels of the pixel array section 100 described later.

[Configuration of Pixel Array Section 100]

Figure 2:
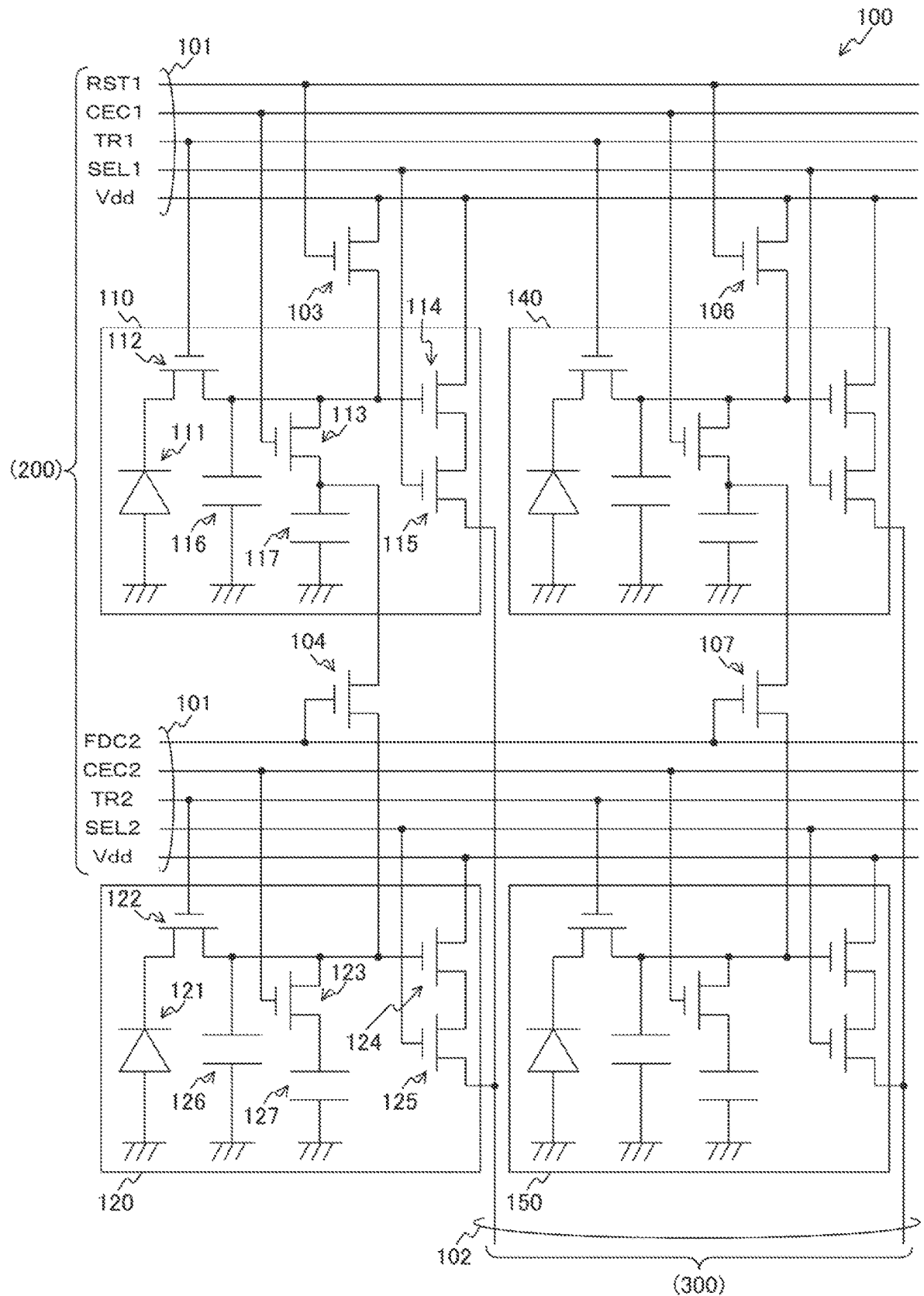
FIG. 2 is a diagram illustrating a configuration example of a pixel array section 100 according to a first embodiment of the present technology.

FIG. 2 is a diagram illustrating a configuration example of the pixel array section 100 according to a first embodiment of the present technology. The figure illustrates a proton of the pixel array section 100.

The pixel array section 100 illustrated in the figure includes pixels 110, 120, 140 and 150, pixel reset sections 103 and 106, and pixel connection sections 104 and 107. Further, in the pixel array section 100, signal lines 101 and 102 are arranged and wired on the pixels 110, 120, 140, and 150.

The pixels 110, 120, 140 and 150 generate an image signal in accordance with the incident light. Details of a configuration of the pixels 110, 120, 140 and 150 will be described later.

The pixel reset section 103 resets the pixel 110 etc. The pixel reset section 103 discharges a charge held in the pixel 110 etc. to thereby perform resetting. Details of a configuration of the pixel reset section 103 will be described later.

The pixel connection sections 104 and 107 conduct between charge holding sections of the later described pixel 110 etc. and thereby hold charges of the charge holding sections of a plurality of pixels 110 etc. in common. Details of a configuration of the pixel connection section 104 etc. will be described later.

The signal line 101 a signal line that transfers a control signal etc. to the pixel 110 etc. As illustrated in the figure, the signal line 101 has a reset signal line RST 1, conversion efficiency change signal lines CEC1 and CEC2, and transfer gate signal lines TR1 and TR2. Further, the signal line 101 further has select signal lines SEL1 and SEL2, a floating diffusion connect signal line FDC2, and a power line Vdd. In the above, signal lines other than the power line Vdd are arranged in each line of the pixel 110 etc. arranged in the pixel array section 100 and are wired in the pixel 110 etc. constituting the line in common. Specifically, these signal lines transfer the control signals different in each line and a common control signal is transferred to the pixel 110 etc. arranged in one line. The conversion efficiency change signal lines CEC1 and CEC2 are signal lines that transfer the control signal for changing a capacity of the charge holding sections (described later) of the pixels arranged in one line and changing the conversion efficiency. The transfer gate signal lines TR1 and TR2 are signal lines that transfer the control signal for transferring a charge generated by the photoelectric conversion section (described later) of the pixels arranged in one line to the charge holding sections. The select signal lines SEL1 and SEL2 are signal lines that transfer the control signal for selecting the pixels arranged in one line at the same time.

In the figure, the signal line arranged in each line is identified with a line number given to the signal line. For example, the conversion efficiency change signal lines CEC1 and CEC2 represent the conversion efficiency change signal lines CEC arranged in a first line and a second line, respectively. The reset signal line RST1 is a signal line that transfers the control signal for resetting the pixels arranged in a plurality of lines. The floating diffusion connect signal line FDC2 is a signal line that transfers the control signal for conducting between the respective charge holding sections of the pixels arranged in the plurality of lines. Even these signal lines are identified with the line number given to them.

As described later, the signal lines are connected to a gate electrode of a MOS transistor. When voltage (hereinafter, referred to as an on-signal) equal to or more than threshold voltage between the gate electrode and a source electrode of the MOS transistor is input to these signal lines, the relevant MOS transistor is kept conductive. Note that the power line Vdd is wired on all the pixels 110 etc. arranged in the pixel array section 100 in common. The control signal transferred by the signal line 101 generated by the vertical drive section 200.

The signal line 102 is a signal line that transfers the image signal that has been generated by the pixel 110 etc. Further, the signal line 102 is arranged in each column of the pixel 110 etc. arranged in the pixel array section 100 and is wired on the pixel 110 etc. constituting the column in common. Specifically, the signal line 102 transfers the image signal in each column. The image signal transferred by the signal line 102 is input to the horizontal drive section 300. Further, a grounding wire is wired on all the pixels 110 etc. of the pixel array section 100.

Note that the pixel array section 100 is an example of a solid-state image pickup device described in claim.

[Configuration of Pixel]

A configuration of the pixel will be described while exemplifying the pixel 110. The pixel 110 includes a photoelectric conversion section 111, a charge transfer section 112, a holding charge control section 113, a signal generation section 114, a selection section 115, a charge holding section 116, and a second charge holding section 117. Note that, for example, an N-channel MOS transistor can be used as the charge transfer section 112, the holding charge control section 113, the signal generation section 114, and the selection section 115.

An anode electrode of the photoelectric conversion section 111 is grounded and a cathode electrode thereof is connected to a source electrode of the charge transfer section 112. A gate electrode of the charge transfer section 112 is connected to the signal line TR1 and a drain electrode thereof is connected to a drain electrode of the holding charge control section 113, a gate electrode of the signal generation section 114, and one end of the charge holding section 116. The other end of the charge holding section 116 is grounded. A gate electrode of the holding charge control section 113 is connected to the conversion efficiency change signal line CEC1 and a source electrode thereof is connected to one end of the second charge holding section 117. The other end of the second charge holding section 117 is grounded. A drain electrode of the signal generation section 114 is connected to the power line Vdd and a source electrode thereof is connected to a drain electrode of the selection section 115. A gate electrode of the selection section 115 is connected to the select signal line SEL1 and a source electrode thereof is connected to the signal line 102.

The photoelectric conversion section 111 generates and holds a charge in accordance with irradiated light. A photodiode can be used as the photoelectric conversion section 111. A period in which the photoelectric conversion section 111 performs photoelectric conversion corresponds to an exposure period.

The charge transfer section 112 transfers the charge held by the photoelectric conversion section 111 to the charge holding section 116. The charge transfer section 112 conducts between the photoelectric conversion section 111 and the charge holding section 116 to thereby transfer the charge. An on-signal is input to the charge transfer section 112 through the transfer gate signal line TR1.

The charge holding section 116 holds the charge that has been transferred by the charge transfer section 112. That is, the charge holding section 116 holds a charge that has been generated by the photoelectric conversion section 111. As the charge holding section 116, a floating diffusion region that has been formed in a diffusion layer of a semiconductor substrate can be used. The charge holding section 116 is also a charge-voltage converting means. Specifically, since the charge holding section 116 is a stray capacitance, a voltage of the electrode on the side connected to the signal generation section 114 in two electrodes of the charge holding section 116 is a voltage according to a charge amount held by the charge holding section 116. Note that ratio of a voltage to the charge amount held by the charge holding section 116 corresponds to the conversion efficiency of the charge-voltage conversion. The conversion efficiency is inversely proportional to a capacity (electrostatic capacity) of the charge holding section 116. Specifically, as a capacity of the charge holding section 116 is more decreased, the conversion efficiency the pixel 110 can be more heightened. Further, the visibility in a low illuminance environment can be improved. However in a case where the conversion efficiency is high, a saturation of the image signal is easy to cause. Details of a relationship between the conversion efficiency and the image signal will be described later.

The holding charge control section 113 conducts between the charge holding section 116 and the second charge holding section 117 and thereby the charge that has been generated by the photoelectric conversion section 111 is held by the charge holding section 116 and the second charge holding section 117. The on-signal is input into the holding charge control section 113 through the conversion of efficiency change signal line CEC1.

The second charge holding section 117 holds the chars that has been generated by the photoelectric conversion section 111 in the similar manner as in the charge holding section 116. When the holding charge control section 113 conducts, the charge that has been generated by the photoelectric conversion section 111 is held in common by the charge holding section 116 and the second charge holding section 117. This corresponds to an increase in the capacity of the charge holding section 116 and allows the above-described conversion efficiency to be reduced. A capacitor can be used as the second charge holding section 117.

The signal generation section 114 generates a signal as the image signal in accordance with a charge that has been held by the charge holding section 116. The signal generation section 114 amplifies a voltage of the charge holding section 116 that is the charge-voltage converting means to thereby generate the image signal.

The selection section 115 outputs the image signal that has been generated by the signal generation section 114 to the signal line 102. The on-signal is input into the selection section 115 through the select signal line SEL1.

The pixel 120 includes a photoelectric conversion section 121, a charge transfer section 122, a holding charge control section 123, a signal generation section 124, a selection section 125, a charge holding section 126, and a second charge holding section 127. These configurations are similar to those of the above-described pixel 110, and therefore descriptions are omitted.

Further, a gate electrode of the pixel connection section 104 is connected to the floating diffusion connect signal line FDC2. A drain electrode and a source electrode of the pixel connection section 104 are connected to a source electrode of the holding charge control section 113 and a drain electrode of the charge transfer section 122, respectively. The pixel connection section 104 conducts between the charge holding section 116 of the pixel 110 and the charge holding section 126 of the pixel 120. The process allows the charge holding sections 116 and 126 to mutually hold the charge that has been generated by either one of the photoelectric conversion sections 111 and 121. The pixel connection section 104 according to the first embodiment of the present technology conducts between the charge holding sections 116 and 126 via the holding charge control section 113. The process permits the capacity of the charge holding section 116 to be increased in the similar manner as in the above-described second charge holding section 117.

On this occasion, the existing charge holding sections are allowed to be connected in parallel and the capacity is allowed to be increased, and therefore the capacity can be allowed to be increased without adding devices such as the second charge holding section 117. Further, in the similar manner as in the pixel array section 100 illustrated the figure, the pixel array section 100 has the second charge holding section 117, the holding charge control section 113, and the pixel connection section 104. In the case, the capacity can be changed in a multiple-stage and the conversion efficiency can be changed in the multiple-stage. A change-over or the conversion efficiency in the multiple-stage will be described later. Further, in the pixel array section 100 illustrated in the figure, the pixel connection section 104 conducts between the charge holding sections 116 and 126 of the adjacent pixels 110 and 120. The process permits a wiring channel of the pixel connection section 104 to be shortened and permits a wiring resistance to be reduced. The pixel connection section 104 conducts between the charge holding sections of two pixels (pixels 110 and 120). Further, the pixel connection section 104 can conduct between the charge holding sections of three or more pixels and allow three or more charge holding sections to hold a charge that has been generated by one photoelectric conversion section.

Further, a gate electrode of the pixel reset section 103 is connected to the reset signal line RST1. A drain electrode and a source electrode of the pixel reset section 103 are connected to the power line Vdd and a drain electrode of the charge transfer section 112, respectively. The pixel reset section 103 discharges the charge that has been held by the charge holding section 116 so as to perform a reset. The pixel reset section 103 applies a power supply voltage to the charge holding section 116 to thereby discharge the charge. On the occasion, the holding charge control section 113 and the pixel connection section 104 are allowed to conduct and thereby can discharge a charge of the charge holding section 126 of the pixel 120. As described above, the pixel connection section 104 is allowed to conduct, and thereby a reset of the plurality of pixels can be performed by using one pixel reset section 103.

Note that when the pixel reset section 103 is allowed to conduct, the holding charge control section 113 conducts to thereby reset the second charge holding section 117. Similarly, the pixel reset section 103, the holding charge control section 113, the pixel connection section 104, and the holding charge control section 123 conduct to thereby reset the second charge holding section 127.

Configurations of the pixels 140 and 150, the pixel reset section 106, and the pixel connection section 107 are similar to those of the above-described pixel 110 etc., and therefore descriptions are omitted.

[Configuration of Horizontal Drive Section]

Figure 3:
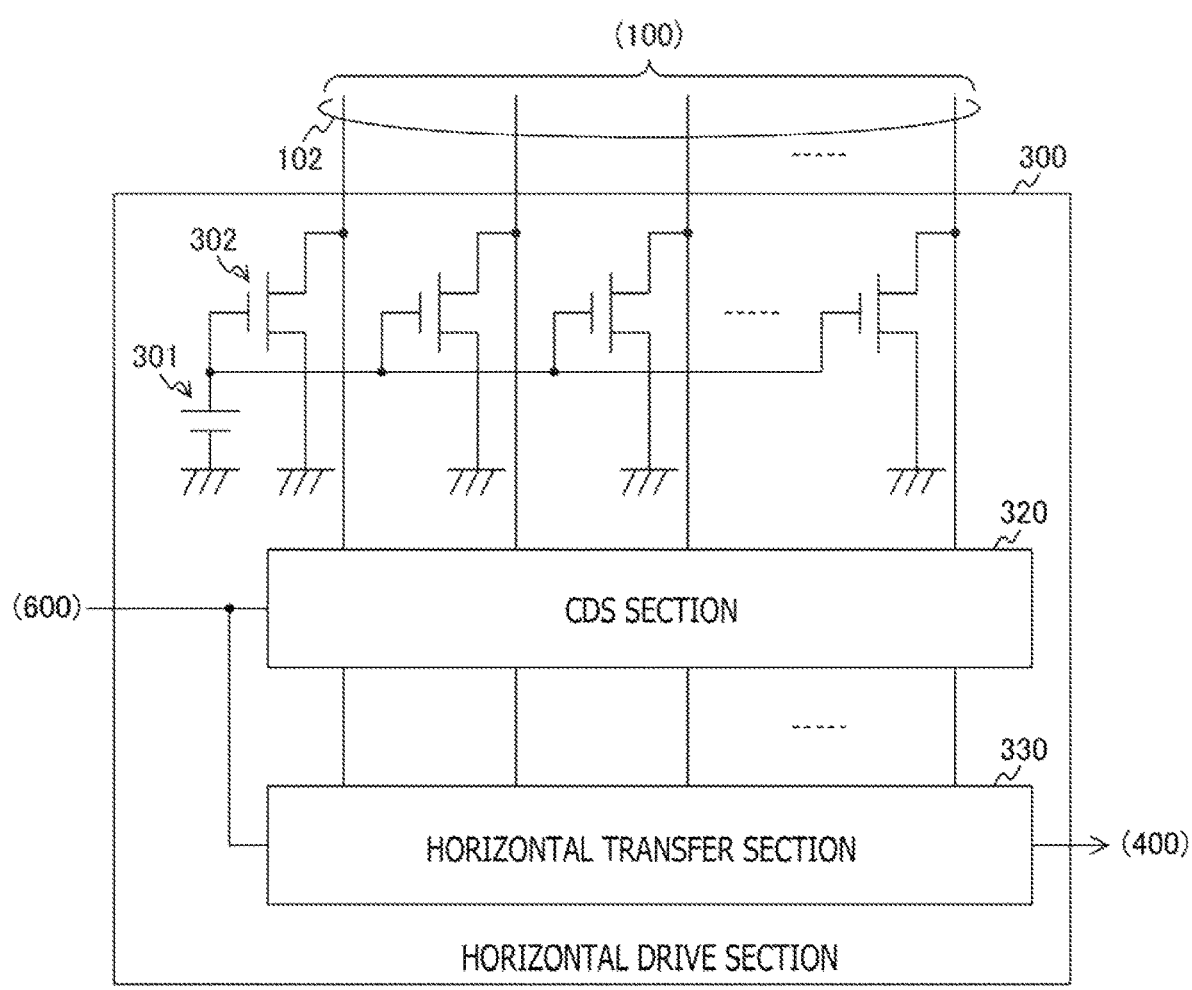
FIG. 3 is a diagram illustrating a configuration example of a horizontal drive section 300 according to the embodiment of the present technology.

FIG. 3 is a diagram illustrating a configuration example of the horizontal drive section 300 according to an embodiment of the present technology. The horizontal drive section 300 includes a voltage supply 301, a MOS transistor 302, a correlated double sampling (CDS) section 320, and a horizontal transfer section 330. The MOS transistor 302 is arranged in each signal line 102 connected to the horizontal drive section 300. Gate electrodes of these MOS transistors 302 are connected to an output terminal of the voltage supply 301 in common. Further, drain electrodes of the MOS transistors 302 each are connected to the signal line 102 and source electrodes thereof are grounded.

The voltage supply 301 applies a predetermined voltage to a gate electrode of the MOS transistor 302.

The MOS transistor 302 constitutes a constant current power source and operates as a load of the signal generation section 114 illustrated in FIG. 2. A current flows in the MOS transistor 302 in accordance with the voltage applied by the voltage supply 301.

The correlated double sampling section 320 performs correlated double sampling on the image signal output from the pixel array section 100. In the correlated double sampling, a difference is generated between the image signal and a reset voltage that is an output from the pixel 110 at the time of performing reset by using the pixel reset section 103 illustrated in FIG. 2, and thereby peculiar pattern noises in each pixel are removed. The image signal after the correlated double sampling is output to the horizontal transfer section 330.

The horizontal transfer section 330 horizontally transfers the image signal output from the correlated double sampling section 320 and outputs the image signal to the automatic gain control section 400. In the horizontal transfer, for example, the image signal corresponding to the leftmost signal line 102 up to the image signal corresponding to the rightmost signal line 102 illustrated in the figure is output in sequence.

Note that the correlated double sampling section 320 is an example of a processing circuit described in claim.

[Relationship Between Incident Light Amount and Image Signal Voltage]

Figure 4:
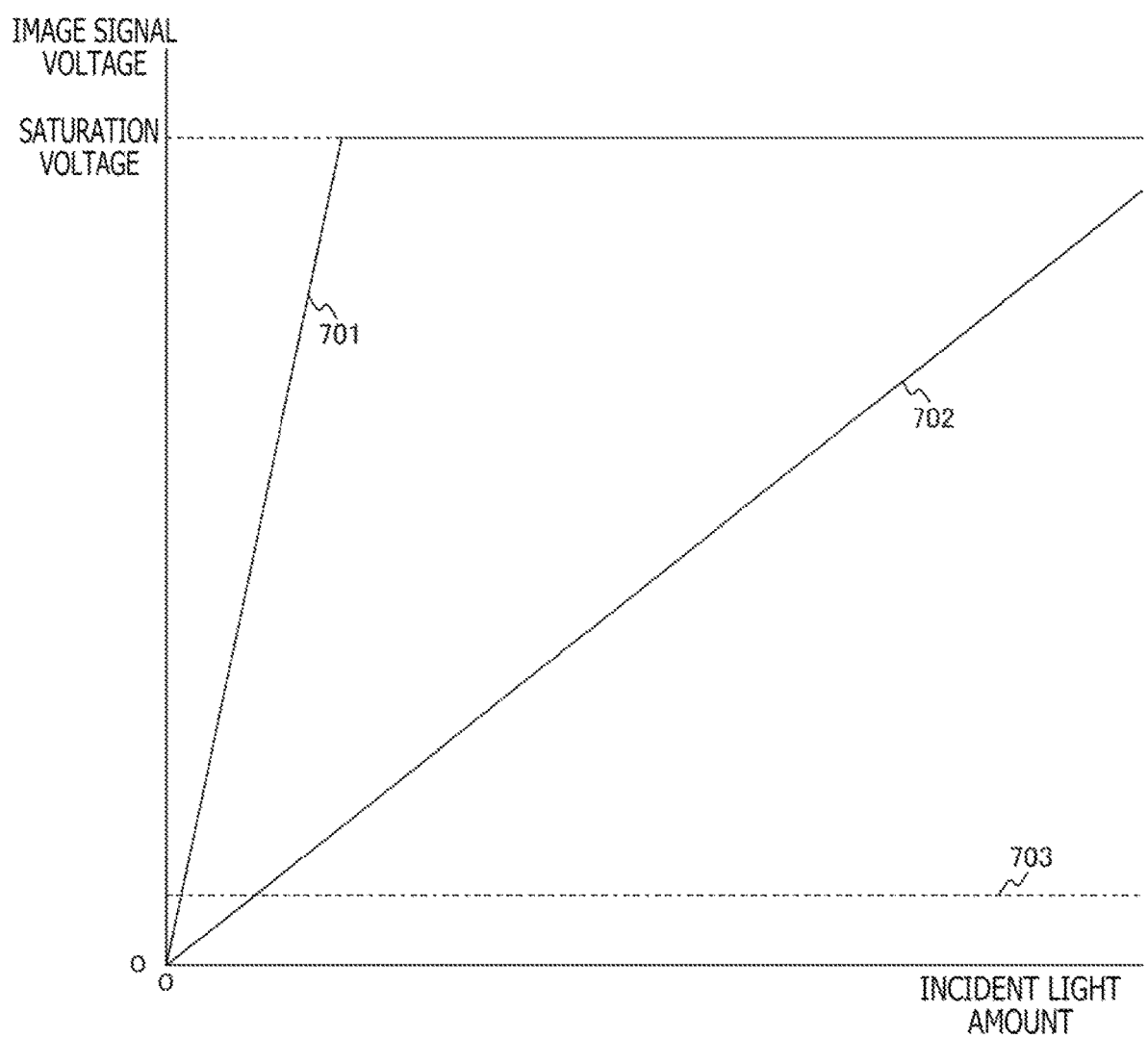
FIG. 4 is a diagram illustrating an example of a relationship between an incident light amount and an image signal voltage according to the first embodiment of the present technology.

FIG. 4 is a diagram illustrating an example of a relationship between an incident light amount and an image signal voltage according to the first embodiment of the present technology. The figure illustrates a relationship between the incident light amount and the image signal voltage in the case where the conversion efficiency is different. Graphs 701 and 702 illustrated in the figure illustrate a relationship between the incident light amount and image signal voltage in the case where the conversion efficiency is high and in the case where the conversion efficiency is low. In addition, a graph 703 illustrates a noise voltage.

As illustrated in the graph 701, in the case where the conversion efficiency is high, a high image signal voltage can be obtained in a relatively low incident light amount. The process permits the visibility to be improved in the low illuminance environment. However, when the incident light amount increases and the image signal voltage reaches a saturation voltage illustrated in the figure, the image signal voltage does not increase any more and an image quality decreases. On the other hand, as illustrated in the graph 702, in the case where the conversion efficiency is low, the image signal of a voltage proportional to the incident light amount in a wide range can be obtained. However, in an area in which the incident light amount is low, a signal-to-noise ratio deteriorates and deterioration of an image quality is caused. To solve the above problem, as described above, a chance-over in the conversion efficiency is performed in the pixel 110 etc. Further, the deterioration of the signal-to-noise ratio is prevented while preventing saturation of the image signal voltage against the incident light amount in the wide range.

[Image Signal Generation Processing]

Figure 5:
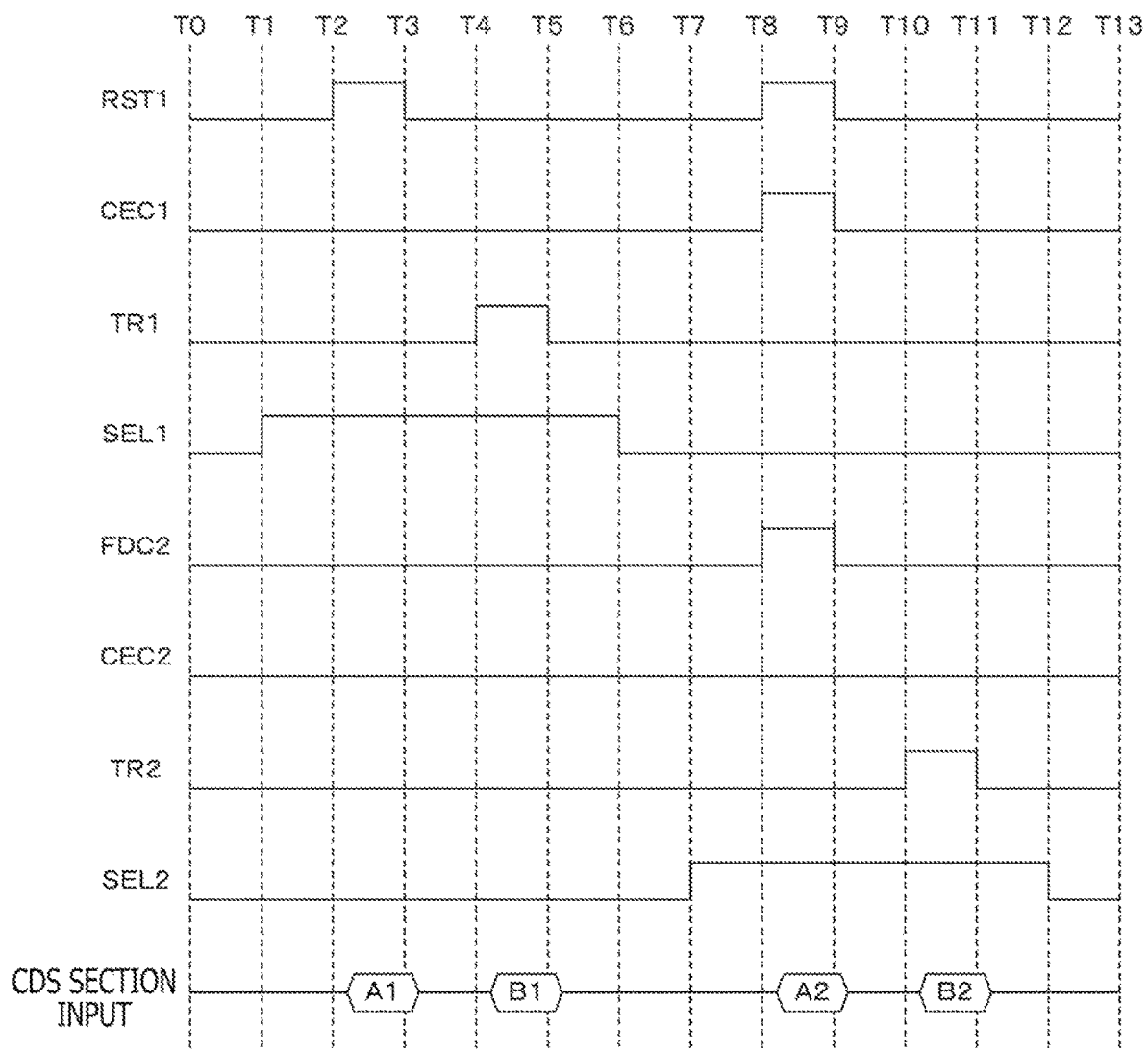
FIG. 5 is a diagram illustrating an example of processing of the image pickup apparatus 10 according to the first embodiment of the present technology.

FIG. 5 is a diagram illustrating an example of processing of the image pickup apparatus 10 according to the first embodiment of the present technology. The figure illustrates generation processing of the image signal in the pixels 110 and 120 illustrated in FIG. 2. Further, the processing illustrated in the figure represents an example in the case where the charge that has been generated by the photoelectric conversion section 111 etc. is held by only the charge holding section 116 etc. arranged in the same pixel. In the figure, RST1 represents a signal of the reset signal line RST1. CEC1 and CEC2 represent signals of the conversion efficiency change signal lines CEC1 and CEC2, respectively. TR1 and TR2 represent signals of the transfer gate signal lines TR1 and TR2, respectively. SEL1 and SEL2 represent signals of the selective signal lines SEL1 and SEL2, respectively. FDC2 represents a signal of the floating diffusion connect signal line FDC2. In the above, a period of a value "1" of a binarized waveform corresponds to an input period of the on-signal. Further, an input of a CDS section in the figure represents an input signal of the correlated double sampling section 320.

In T0 to T1, the on-signal is not applied to all the signal lines and the charge transfer section 112 etc. are kept non-conductive. On this occasion, the photoelectric conversion is performed in the photoelectric conversion sections 111 and 121 and the generated charge is held by the photoelectric conversion sections 111 and 121.

In T1 to 12, the image signal is output from pixels that are arranged in a line containing the pixel 110, and therefore the on-signal is input in the select signal line SEL1. The process permits the selection section 115 to conduct. Note that the on-signal of the select signal line SEL1 is input in T1 to T6.

In T2 to T3, the on-signal is input from the reset signal line RST1 and the pixel reset section 103 conducts. The process permits the charge holding section 116 to be reset. On this occasion, the reset voltage is output from the pixel 110 and is input into the correlated double sampling section 320. In the figure, the above is represented by "A1." This reset is performed to all the pixels that are arranged in the line containing the pixel 110.

In T3 to T4, an input of the on-signal to the reset signal line RST1 is stopped.

In T4 to T5, the on-signal is input from the transfer gate signal line TR1 and the charge transfer section 112 conducts. Through the process, the charge that has been generated and held by the photoelectric conversion section 111 is transferred to the charge holding section 116. On this occasion, the image signal is output from the pixel 110 and is input into the correlated double sampling section 320. In the figure, the above is represented by "B1." Afterward, a calculation "B1-A1" is performed in the correlated double sampling section 320 and the correlated double sampling is performed. An output of the image signal is performed to all the pixels that are arranged in the line containing the pixel 110.

In T5 to T6, an input of the on-signal to the transfer signal line TR1 is stopped. Through this process, a new exposure period is started and holding of the charge that has been generated in the photoelectric conversion section 111 is started.

In T6 to T7, an input of the on-signal to the select signal line SEL1 is stopped and processing of the output of the image signal in the pixels that are arranged in the line containing the pixel 110 ends.

In T7 to T8, the image signal is output from the pixels that are arranged in the line containing the pixel 120, and therefore the on-signal is input in the select signal line SEL2. Through the process, the selection section 125 is kept conductive. Note that the on-signal of the select signal line SEL2 is input in T7 to T12.

In T8 to T9, the on-signal is input from the reset signal line RST1, the conversion efficiency change signal line CEC1, and the floating diffusion connect signal line FDC2. As a result, the pixel reset section 103, the holding charge control section 113, and the pixel connection section 104 conduct. The process permits the charge holding section 126 to be reset. On this occasion, the reset voltage "A2" is output from the pixel 120 and is input into the correlated double sampling section 320. Note that the charge holding section 116 and the second charge holding section 117 are also reset at the same time. This reset is performed on all the pixels that are arranged in the line containing the pixel 120.

In T9 to T10, an input of the on-signal in the reset signal line RST1, the conversion efficiency change signal line CEC1, and the floating diffusion connect signal line FDC2 is stopped.

In T10 to T11, the on-signal is input from the transfer gate signal line TR2, and further the charge transfer section 122 conducts. Through the process, the charge that been generated and held by the photoelectric conversion section 121 is transferred to the charge holding section 126. On this occasion, the image signal "B2" is output from the pixel 120 and is input into the correlated double sampling section 320. Afterward, a calculation "B2-A2" is performed in the correlated double sampling section 320 and the correlated double sampling performed. An output of the image signal is performed on all the pixels that are arranged in the line containing the pixel 120.

In T11 to T13, an input of the on signal in the transfer gate signal line TR2 is stopped (T11 to T12), and further an input of the on-signal in the select signal line SEL2 is stopped (T12 to T13). Through the process, the processing of the output of the image signal in the pixels that are arranged in the line containing the pixel 120 ends.

As described above, the generation and output of the image signal in the pixels 110 and 120 can be performed. Further, the similar processing is performed on the pixels that are arranged in all the lines of the pixel array section 100. The process permits the image signal for one screen to be obtained. In the figure, the charge that has been generated by the photoelectric conversion section 111 etc. is held by only the charge holding section 116 to generate the image signal, and therefore the conversion efficiency can be heightened. Note that as illustrated in the figure, an image pickup system in which the exposure and the generation and output of the image signal are sequentially performed while shifting timing in each line of the pixels that are arranged in the pixel array section 100 is referred to as a rolling shutter system.

[Image Signal Generation Processing (Twice Capacity of Charge Holding Section)]

Figure 6:
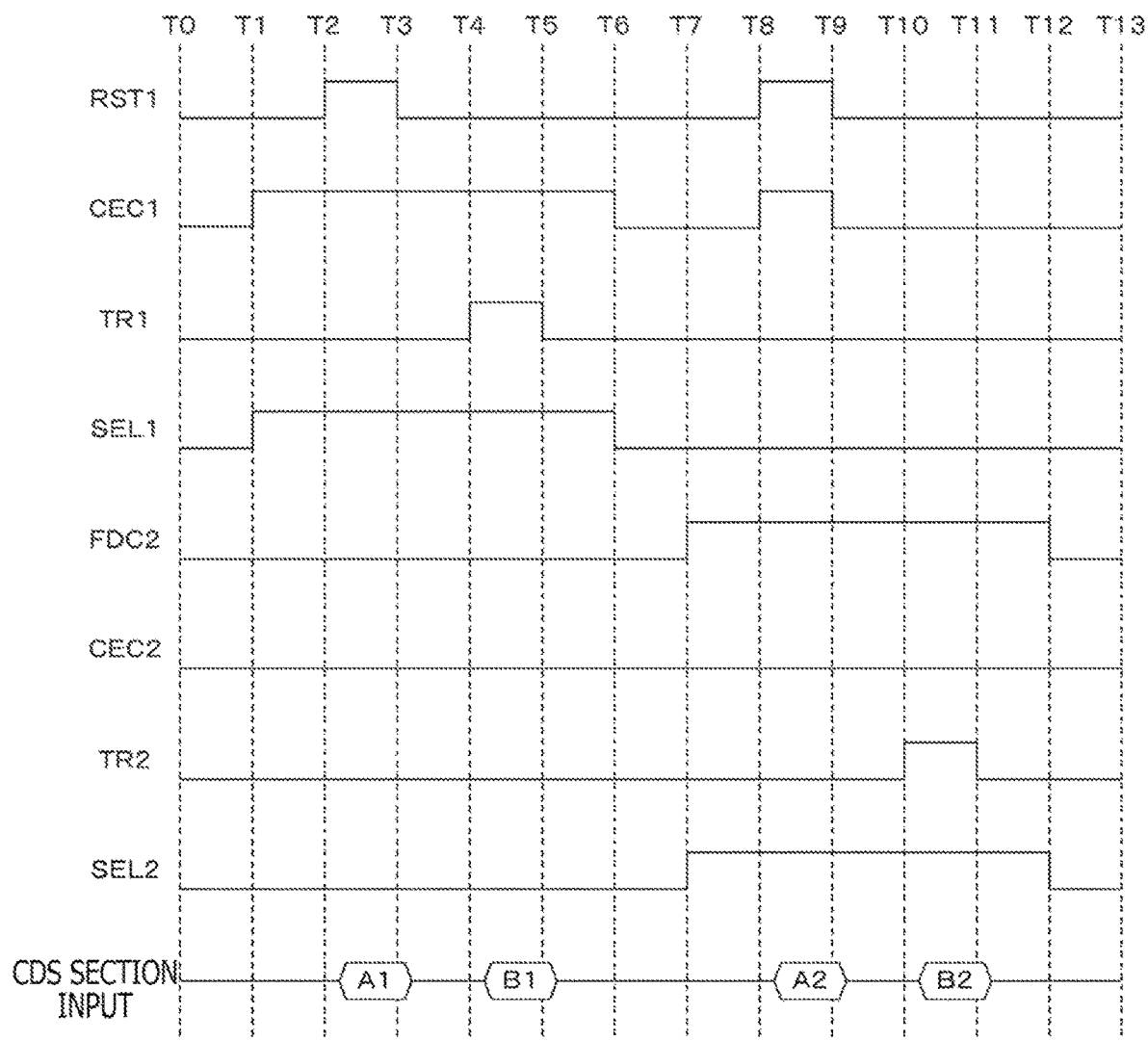
FIG. 6 is a diagram illustrating another example of the processing of the image pickup apparatus 10 according to the first embodiment of the present technology.

FIG. 6 is a diagram illustrating another example of the processing of the image pickup apparatus 10 according to the first embodiment of the present technology. The figure illustrates an example in which the capacity or the charge holding section 116 etc. is increased twice in an apparent value and a charge that has been generated by the photoelectric conversion section 111 etc. is held, as compared with a case illustrated in FIG. 5.

The processing illustrated in the figure differs from the processing illustrated in FIG. 5 in the following points. First, in T1 to T6, the on-signal is input in the conversion efficiency change signal line CEC1. Further, in T7 to T12, the on-signal is input in the floating diffusion connect signal line FDC2.

In T2 to T3, the on-signal is input in the reset signal line RST1 and the conversion efficiency change signal line CEC1, and further the pixel reset section 103 and the holding charge control section 113 conduct. The process permits the second charge holding section 117 to be reset in addition to the charge holding section 116.

In T4 to T5, the on-signal is input in the conversion efficiency change signal line CEC1 and the transfer gate signal line TR1, and further the holding charge control section 113 and the charge transfer section 112 conduct. The process permits the charge that has been generated by the photoelectric conversion section 111 to be held by the charge holding section 116 and the second charge holding section 117.

In T10 to T11, the on-signal is input in the floating diffusion connect signal line FDC2 and the transfer gate signal line TR2, and further the pixel connection section 104 and the charge transfer section 122 conduct. The process permits the charge that has been generated by the photoelectric conversion section 121 to be held by the charge holding section 126 and the second charge holding section 117.

Processings other than the above are similar to those illustrated in FIG. 5, and therefore its descriptions are omitted.

As described above, in the pixel 110, the charge that has been generated by the photoelectric conversion section 111 is held by the charge holding section 116 and the second charge holding section 117. In the pixel 120, the charge that has been generated by the photoelectric conversion section 121 is held by the charge holding section 126 and the second charge holding section 117. In the case where each capacity of the charge holding sections 116 and 126 and the second charge holding section 117 is equal to each other, the same effect as that in the case where the capacity of the charge holding sections 116 and 126 is increased twice obtained. Therefore, the conversion efficiency of the pixels can be divided into halves as compared with the processing illustrated in FIG. 5.

[Image Signal Generation Processing (Three Times Capacity of Charge Holding Section)]

Figure 7:
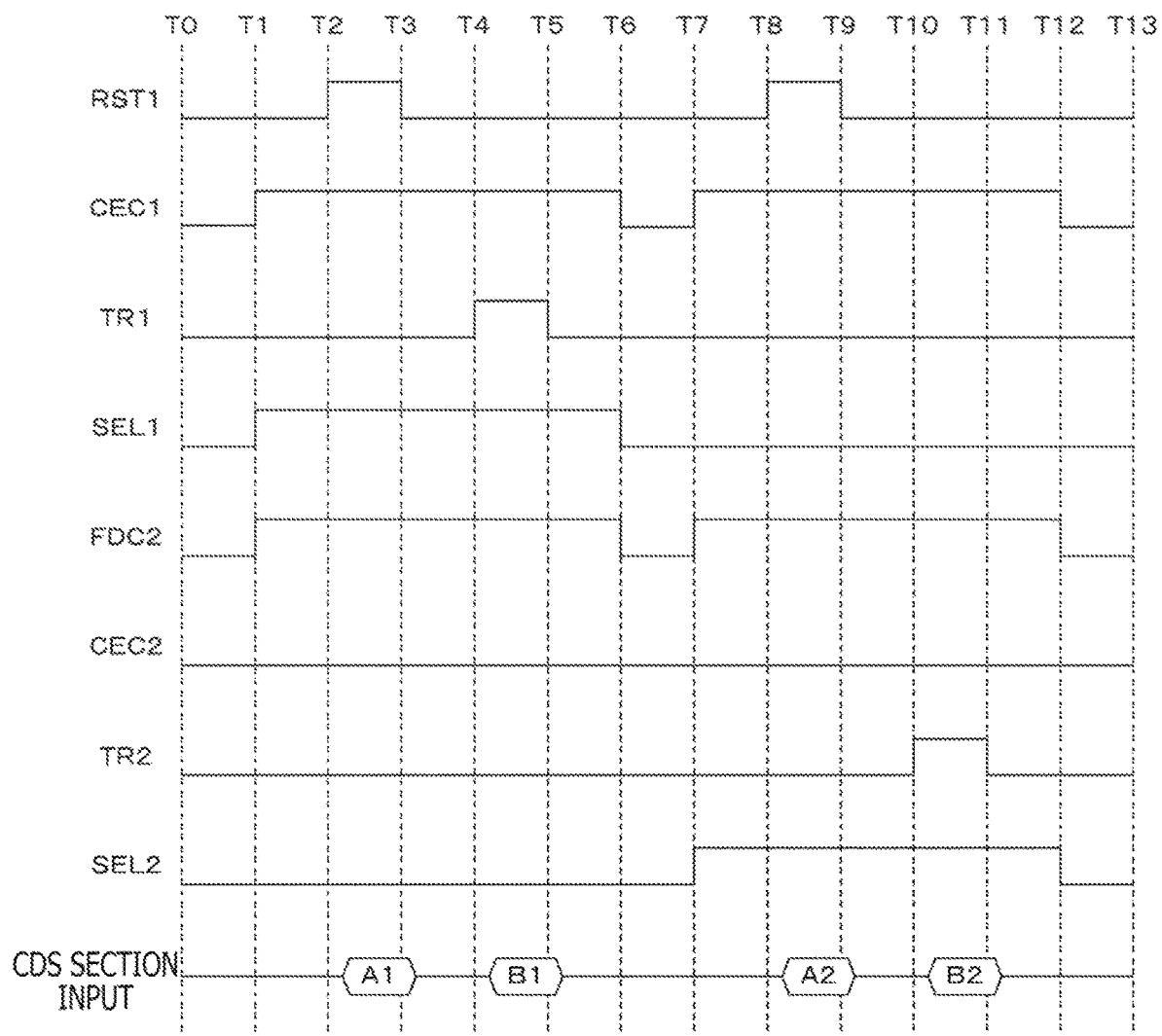
FIG. 7 is a diagram illustrating another example of the processing of the image pickup apparatus 10 according to the first embodiment of the present technology.

FIG. 7 is a diagram illustrating another example of the processing of the image pickup apparatus 10 according to the first embodiment of the present technology. The figure illustrates an example in which the capacity of the charge holding section 116 etc. is increased three times and the charge that has been generated by the photoelectric conversion section 111 etc. is held, as compared with a case illustrated in FIG. 5.

The processing illustrated in the figure differs from the processing illustrated in FIG. 5 in the following points. First, in T1 to T6, the on-signal is input in the conversion efficiency change signal line CEC1 and the floating diffusion connect signal line FDC2. Further, in T7 to T12, the on-signal is input in the conversion efficiency change signal line CEC1 and the floating diffusion connect signal line FDC2.

In T2 to T3, the on-signal is input in the reset signal line RST1, the conversion efficiency change signal line CEC1, and the floating diffusion connect signal line FDC2, and further the pixel reset section 103, the holding charge control section 113, and the pixel connection section 104 conduct. The process permits the charge holding section 116 and the second charge holding sections 117 and 127 to be reset.

In T4 to T5, the on-signal is input in the conversion efficiency change signal line CEC1, the transfer gate signal line TR1, and the floating diffusion connect signal line FDC2, and further the holding charge control section 113, the charge transfer section 112, and the pixel connection section 104 conduct. The process permits the charge that has been generated by the photoelectric conversion section 111 to be held by the charge holding sections 116 and 126 and the second charge holding section 117.

In T10 to T11, the on-signal is input in the conversion efficiency change signal line CEC1, the floating diffusion connect signal line FDC2, and the transfer gate signal line TR2, and further the second charge holding section 117, the pixel connection section 104, and the charge transfer section 122 conduct. The process permits the charge that has been generated by the photoelectric conversion section 121 to be held by the charge holding sections 116 and 126 and the second charge holding section 117.

Processings other than the above are similar to those illustrated in FIG. 5, and therefore its descriptions are omitted.

As described above, in the pixels 110 and 120, the charge that has been generated by the photoelectric conversion section 111 etc. is held by the charge holding sections 116 and 126 and the second charge holding section 117. Through the process, there is obtained the same effect as that in the case where the capacity of the charge holding sections 116 and 126 is increased three times. The conversion efficiency of the pixels can be made one-third, as compared with processing illustrated in FIG. 5.

[Image Signal Generation Processing (Four Times Capacity of Charge Holding Section)]

Figure 8:
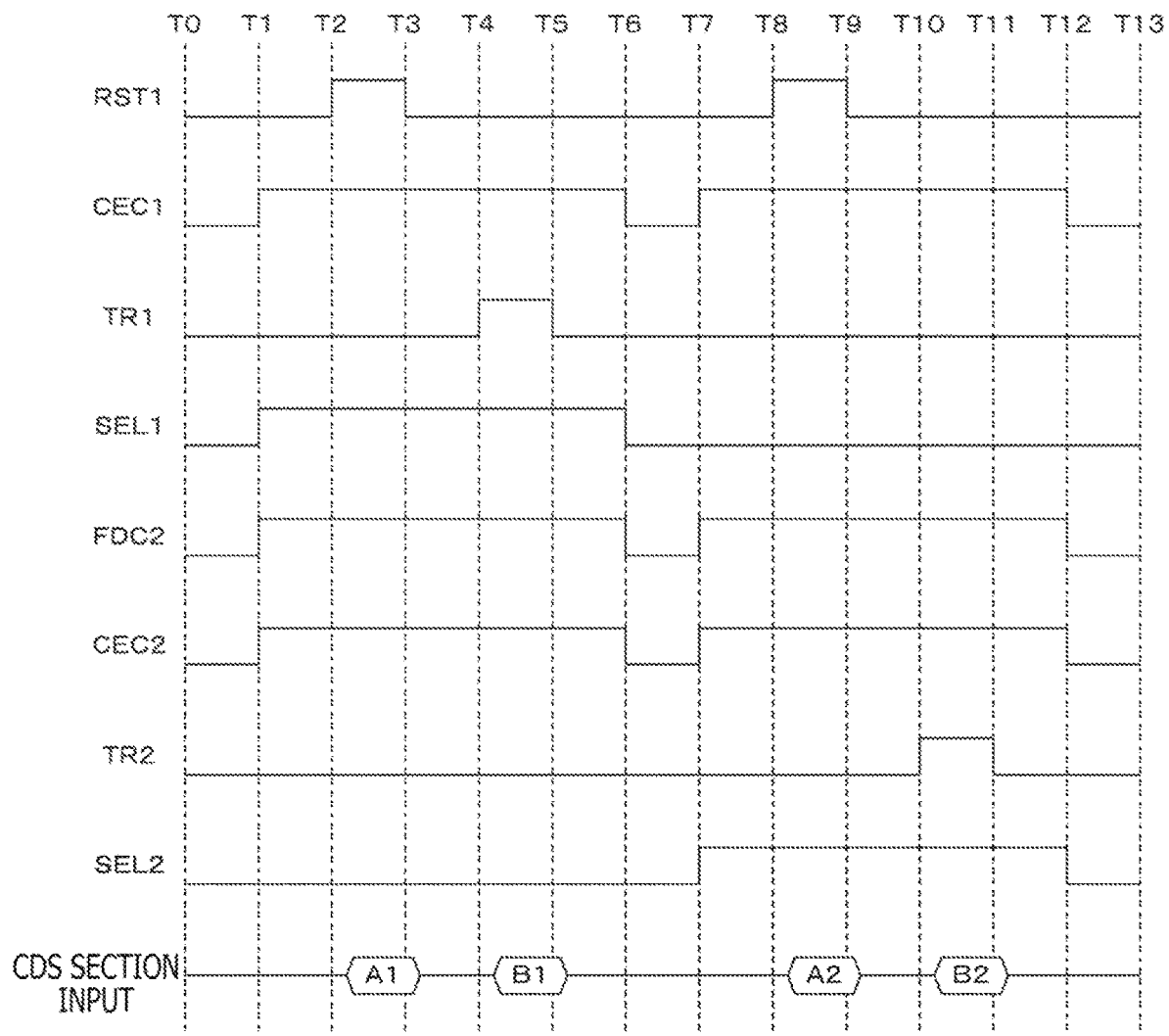
FIG. 8 is a diagram illustrating another example of the processing of the image pickup apparatus 10 according to the first embodiment of the present technology.

FIG. 8 is a diagram illustrating another example of the processing of the image pickup apparatus 10 according to the first embodiment of the present technology. The figure illustrates an example in which the capacity of the charge holding section 116 etc. is increased four times and the charge that has been generated by the photoelectric conversion section 111 etc. is held, as compared with a case illustrated in FIG. 5.

The processing illustrated in the figure differs from the processing illustrated in FIG. 5 in the following points. First, in T1 to T6, the on-signal is input in the conversion efficiency change signal lines CEC1 and CEC2 and the floating diffusion connect signal line FDC2. Further, in T7 to T12, the on-signal is input in the conversion efficiency change signal lines CEC1 and CEC2 and the floating diffusion connect signal line FDC2.

In T2 to T3, the on-signal is input in the reset signal line RST1, the conversion efficiency change signal lines CEC1 and CEC2, and the floating diffusion connect signal line FDC2, and further the pixel reset section 103, the holding charge control sections 113 and 123, and the pixel connection section 104 conduct. The process permits the charge holding sections 116 and 126 and the second charge holding sections 117 and 127 to be reset.

In T4 to T5, the on-signal is input in the transfer gate signal line TR1, the conversion efficiency change signal lines CEC1 and CEC2, and the floating diffusion connect signal line FDC2, and further the charge transfer section 112, the holding charge control sections 113 and 123, and the pixel connection section 104 conduct. The process permits the charge that has been generated by the photoelectric conversion section 111 to be held by the charge holding sections 116 and 126 and the second charge holding sections 117 and 127.

In T8 to T9, the on-signal is input in the reset signal line RST1, the conversion efficiency change signal lines CEC1 and CEC2, and the floating diffusion connect signal line FDC2, and further the pixel reset section 103, the holding charge control sections 113 and 123, and the pixel connection section 104 conduct. The process permits the charge holding sections 116 and 126 and the second charge holding sections 117 and 127 to be reset.

In T10 to T11, the on-signal is input in the transfer gate signal line TR2, the conversion efficiency change signal lines CEC1 and CEC2, and the floating diffusion connect signal line FDC2, and further the charge transfer section 122, holding charge control sections 113 and 123, and the pixel connection section 104 conduct. The process permits the charge that has been generated by the photoelectric conversion section 121 to be held by the charge holding sections 116 and 126 and the second charge holding sections 117 and 127.

Processings other than the above are similar to those illustrated in FIG. 5, and therefore its descriptions are omitted.

As described above, in the pixels 110 and 120, the charge that has been generated by the photoelectric conversion section 111 etc. is held by the charge holding sections 116 and 126 and the second charge holding sections 117 and 127. Through the process, there is obtained the same effect as that in the case where the capacity of the charge holding sections 116 and 126 is increased four times. The conversion efficiency of the pixels can be made one-fourth, as compared with the processing illustrated in FIG. 5

[Relationship Between Incident Light Amount and Image Signal Voltage]

Figure 9:
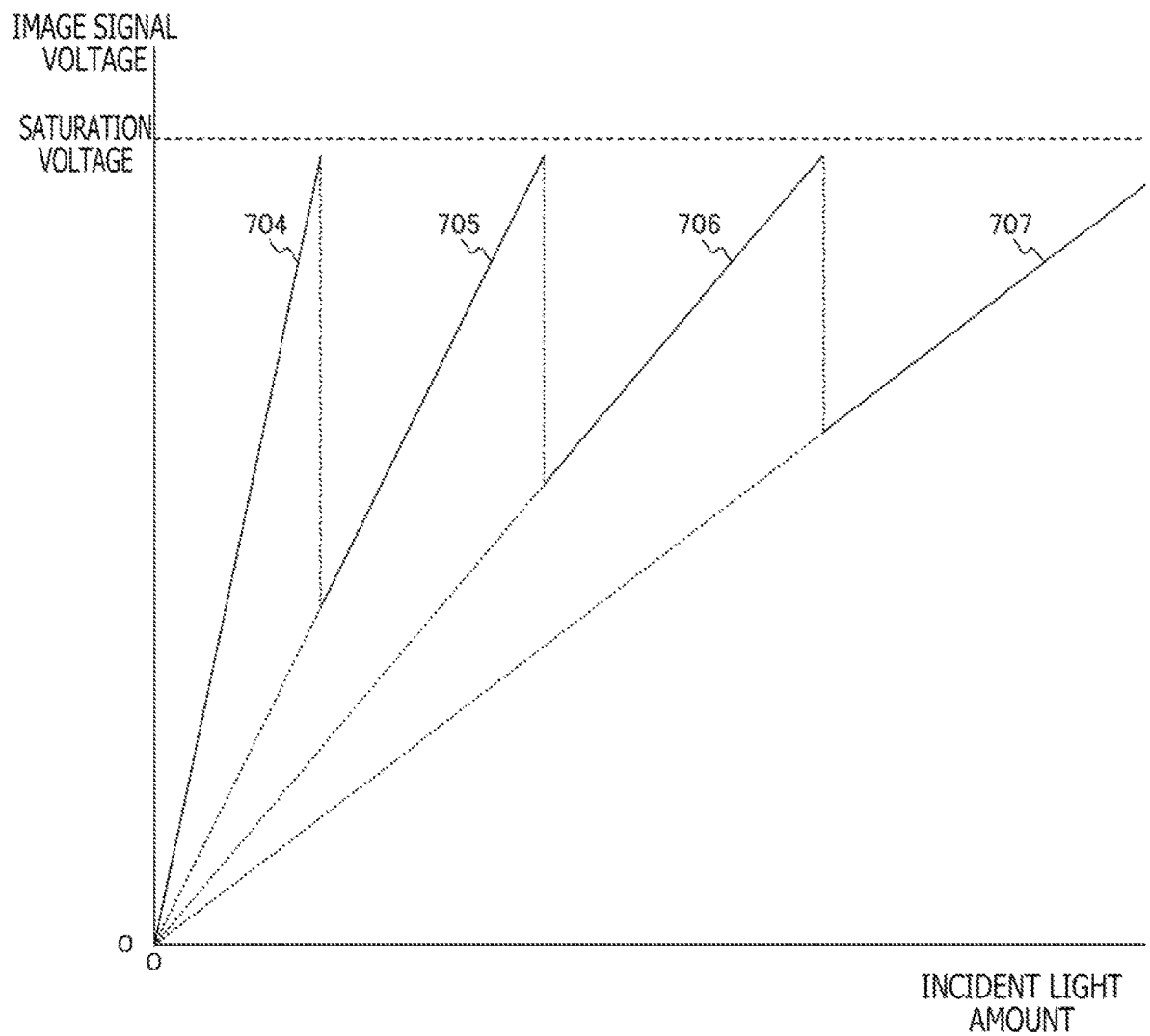
FIG. 9 is a diagram illustrating another example of a relationship between the incident light amount and the image signal voltage according to the first embodiment of the present technology.

FIG. 9 is a diagram illustrating another example of a relationship between the incident light amount and the image signal voltage according to the first embodiment of the present technology. The figure illustrates an example in the case where the processing illustrated in FIGS. 5 to 8 is applied and the conversion efficiency is switched into four stages.

In the case where the incident light amount is small, the processing illustrated in FIG. 5 is carried out. Through the process, a highest conversion efficiency illustrated in a graph 704 is obtained. Before the incident light amount increases and the image signal voltage reaches the saturation voltage, a processing system is changed into the processing (twice the capacity of the charge holding section) illustrated in FIG. 6. Through the process, a conversion efficiency illustrated in a graph 705 is obtained. Similarly, the processing system is changed in sequence into the processing (three times the charge holding section) illustrated in FIG. 7 and the processing (four times the charge holding section) illustrated in FIG. 8 in sequence. The control section 600 illustrated in FIG. 1 controls the vertical drive section 200 on the basis of the image signal output by the horizontal drive section 300 to thereby achieve the above.

Through the process, the conversion efficiency is changed into those illustrated by graphs 706 and 707. As described above, a wide dynamic range can be obtained while preventing the saturation voltage of the image signal voltage. Further, since the conversion efficiency is switched in the multiple-stage, a change amount of the image signal voltage before and after the switching becomes small. The process permits reduction in the image quality to be alleviated.

[Configuration of Pixel]

Figure 10:
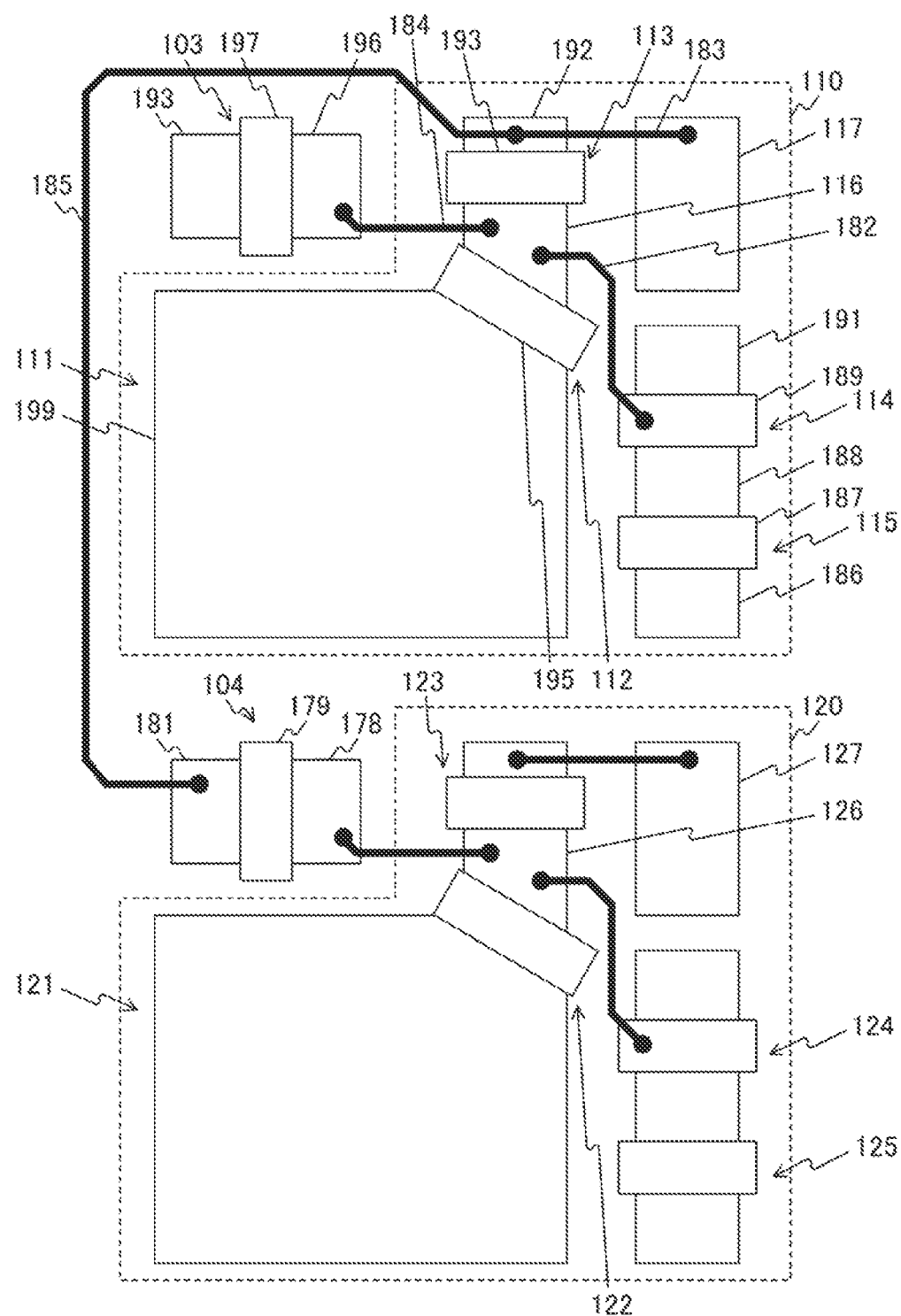
FIG. 10 is a schematic top diagram illustrating a configuration example of a pixel according to the first embodiment of the present technology.

FIG. 10 is a schematic top diagram illustrating a configuration example of the pixel according to the first embodiment of the present technology. The figure is a diagram schematically illustrating a configuration example of diffusion layers, gate electrodes, and wiring of the pixels 110 and 120 that are formed in a semiconductor substrate. In the figure, the pixels 110 and 120 are assumed to be formed in a well region of a P-type semiconductor. As a matter of convenience, regarding wiring between each portion of the pixel 110 and the signal line 101 etc. its descriptions are omitted.

First, a configuration of the pixel 110 will be described. An N-type semiconductor region 199 of the photoelectric conversion section 111 is arranged in a left lower portion of the pixel 110. In a PN junction part that is formed between the N-type semiconductor region 199 and the P-type well region, the photoelectric conversion is performed. Further, the generated charge is held by the N-type semiconductor region 199. A gate electrode 195 of the charge transfer section 112 is arranged in a right upper portion of the photoelectric conversion section 111. Note that a gate electrode can include polysilicon and be formed on a surface of a semiconductor substrate via a gate oxide film. The charge holding section 116 is arranged adjacent to the gate electrode 195. The charge holding section 116 is configured by the N-type semiconductor region (floating diffusion) that is formed in the well region. Note that the charge transfer section 112 corresponds to a MOS transistor using as a source electrode and a drain electrode the N-type semiconductor region 199 and the charge holding section 116, respectively. An N-type semiconductor region 192 constituting a gate electrode 193 or the holding charge control section 113 adjacent to the charge holding section 116 and the drain electrode of the holding charge control section 113 is arranged in sequence. Note that the charge holding section 116 corresponds to the source electrode of the holding charge control section 113.

The second charge holding section 117 is arranged on the right side of the holding charge control section 113. In the similar manner as in the above-described gate electrode, the second charge holding section 117 can include polysilicon and be formed on a surface of the semiconductor substrate via a gate oxide film. Further, the second charge holding section 117 constitutes a capacitor between the second charge holding section 117 and the well region. The second charge holding section 117 is connected to the N-type semiconductor region 192 of the holding charge control section 113 through wiring 183. The wiring can, for example, include metal.

Further, an N-type semiconductor region 191 constituting the drain electrode of the signal generation section 114, a gate electrode 189 of the signal generation section 114, and an N-type semiconductor region 188 constituting a source electrode of the signal generation section 114 are arranged in sequence on the right side of the photoelectric conversion section 111. Further, a gate electrode 187 of the selection section 115 adjacent to the N-type semiconductor region 188 and an N-type semiconductor region 186 constituting a source electrode of the selection section 115 are arranged in sequence. Note that the N-type semiconductor region 188 doubles as the drain electrode of the selection section 115. The gate electrode 189 of the signal generation section 114 is connected to the charge holding section 116 through wiring 182. The gate electrode 189 is connected to the charge holding section 116 through the wiring 182.

The pixel reset section 103 is arranged in the vicinity of the pixel 110. In the figure, the pixel reset section 103 is arranged in a left upper portion of the pixel 110. In the pixel reset section 103, an N-type semiconductor region 193 constituting a drain electrode, a gate electrode 197, and an N-type semiconductor region 196 constituting a source electrode are formed and configured in sequence adjacent to each other. The N-type semiconductor region 196 is connected to the charge holding section 116 through wiring 184.

Even in the pixel 120, in the similar manner as in the pixel 110, the photoelectric conversion section 121, the charge transfer section 122, the holding charge control section 123, the signal generation section 124, the selection section 125, the charge holding section 126, and the second charge holding section 127 are arranged.

The pixel connection section 104 is arranged in the vicinity of the pixel 120. Further, in the similar manner as in the pixel reset section 103, the pixel connection section 104 is arranged in a left upper portion of the pixel 120. In the pixel connection section 104, an N-type semiconductor region 181 constituting a drain electrode, a gate electrode 179, and an N-type semiconductor region 178 constituting a source electrode are formed and configured in sequence adjacent to each other. In the similar manner as in the N-type semiconductor region 196 of the pixel reset section 103, the N-type semiconductor region 178 is connected to the charge holding section 126. Further, the N-type semiconductor region 181 is connected to the N-type semiconductor region 192 of the holding charge control section 113 of the pixel 110 through wiring 185.

As described above, the pixel reset section 103 and the pixel connection section 104, respectively, can be configured by using the MOS transistor having substantially the same shape. Through the process, properties of the pixel reset section 103 and the pixel connection section 104 can be made the same. In addition, the pixel 110 and the pixel reset section 103 can have substantially the same shapes as those of the pixel 120 and the pixel connection section 104. Properties of the pixels 110 and 120 can be made the same, and at the same time, the diffusion layers of the semiconductor substrates can be configured similarly in the pixels.

Figure 11:
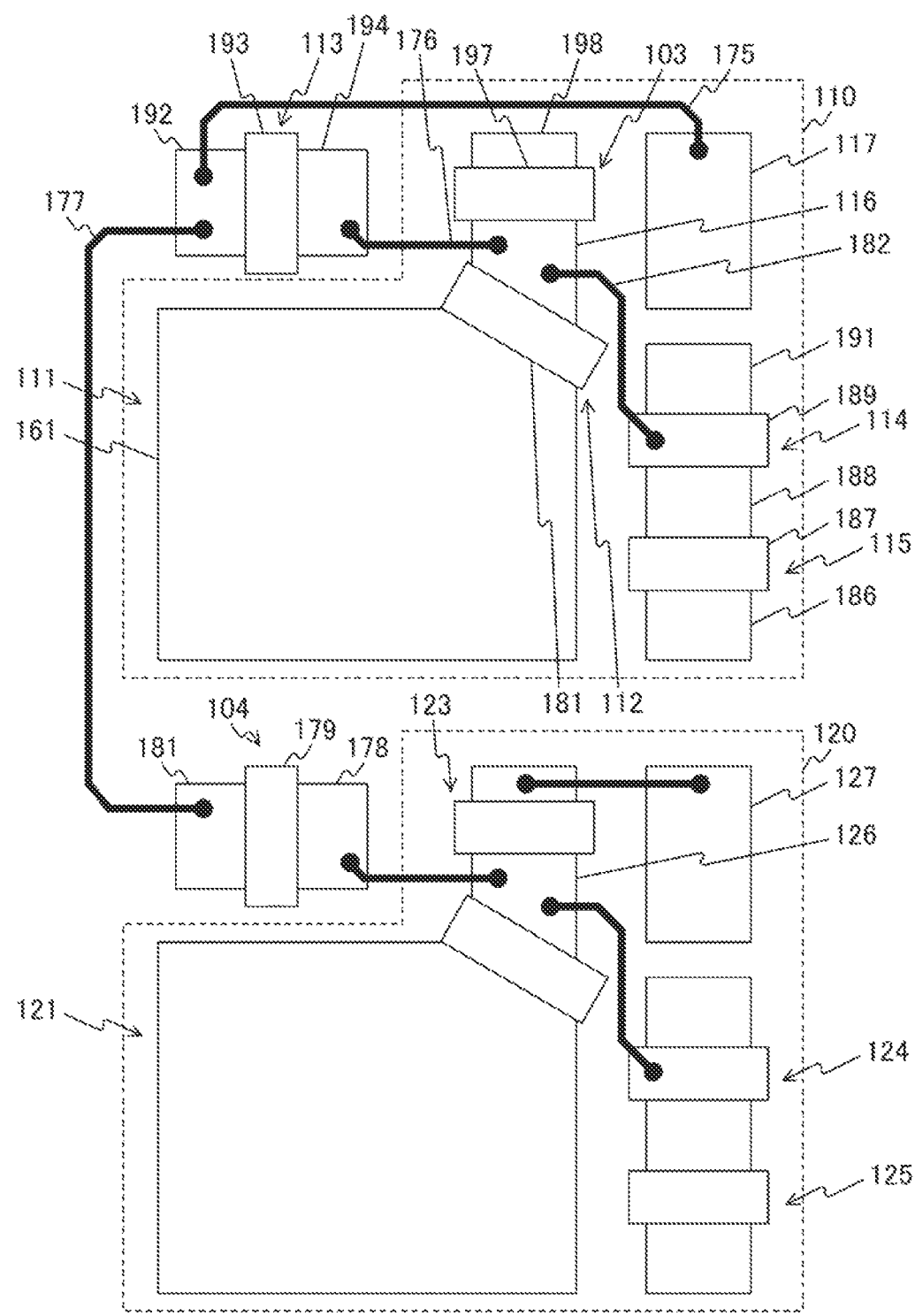
FIG. 11 a schematic top diagram illustrating another example of a configuration of the pixel according to the first embodiment of the present technology.

FIG. 11 is a schematic top diagram illustrating another example of the configuration of the pixel according to the first embodiment of the present technology. The pixel 110 etc. illustrated in the figure differ from those illustrated in FIG. 10 in that the pixel reset section 103 and the holding charge control section 113 are replaced and arranged. An N-type semiconductor region 194 constituting the drain electrode of the holding charge control section 113 is connected to the charge holding section 116 through wring 176. The N-type semiconductor region 192 constituting the source electrode of the holding charge control section 113 is connected to the second charge holding section 117 through wiring 175. Further, the N-type semiconductor region 192 is connected to the N-type semiconductor region 181 of the pixel connection section 104 through wiring 177.

In an example illustrated in the figure, the holding charge control section 113 and the pixel connection section 104, respectively, are configured by using the MOS transistor having substantially the same shape. In addition, the pixel 110 and the holding charge control section 113 have substantially the same shapes as those of the pixel 120 and the pixel connection section 104. Through the process, the holding charge control section 113 and the pixel connection section 104 can be configured so as to have substantially the same property. In addition the properties of the pixels 110 and 120 can be made the same.

As described above, according to the first embodiment the present technology, the charge holding sections 116 and 126 that are arranged in the pixels 110 and 120, respectively, are connected with the pixel connection section 104. Through the process, the charge that has been generated by one photoelectric conversion section is allowed to be held by the charge holding sections 116 and 126. Through the process, the capacity of the charge holding section can be changed and the conversion efficiency can be switched while preventing an increase in an area of the pixel.

Modification Example

According to the above-described first embodiment, the pixel connection section 104 and the charge holding section 116 are connected via the holding charge control section 113. By contrast, the pixel connection section 104 may be directly connected to the charge holding sections 116. A modification example of the first embodiment of the present technology differs from the above-described first embodiment in that the pixel connection section 104 and the charge holding section 116 are directly connected to each other.

[Configuration of Pixel Array Section 100]

Figure 12:
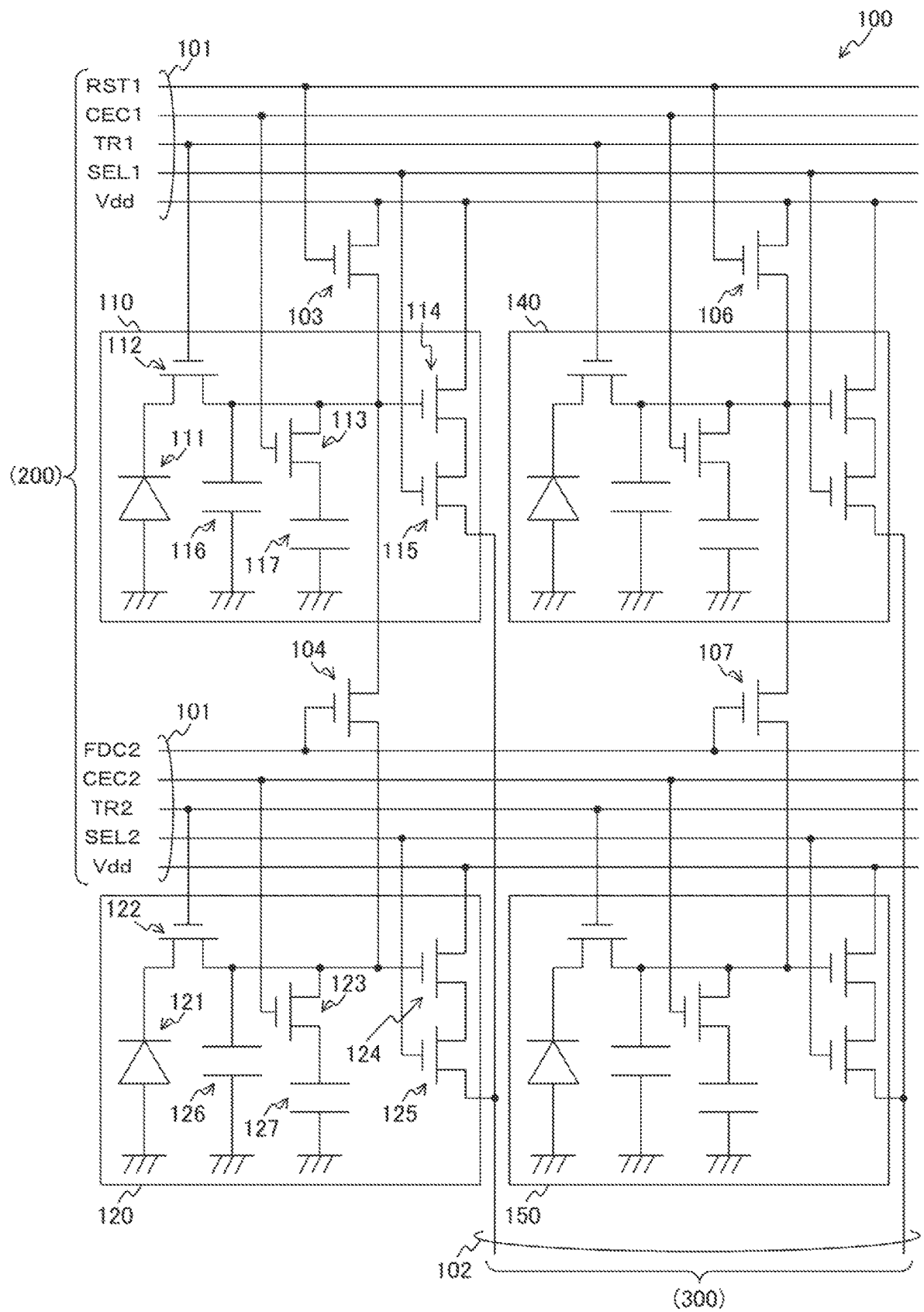
FIG. 12 is a diagram illustrating a configuration example of the pixel array section 100 according to a modification example of the first embodiment of the present technology.

FIG. 12 is a diagram illustrating a configuration example of the pixel array section 100 according to the modification example of the first embodiment of the present technology. The pixel array section 100 illustrated in the figure differs from the pixel array section 100 illustrated in FIG. 2 in that a drain electrode of the pixel connection section 104 is connected to the gate electrode of the signal generation section 114. Even in the pixel array section 100 illustrated in the figure, the capacity of the charge holding section can be changed into four stages. This situation will be described while exemplifying the pixel 110. In the case where the holding charge control section 113 is further allowed to conduct at the time of allowing the charge transfer section 112 to conduct, the capacity of the charge holding section can be doubled. In the case where the pixel connection section 104 is further allowed to conduct in addition to the holding charge control section 113, the capacity of the charge holding section can be tripled. In the case where the holding charge control sections 113 and 123 and the pixel connection section 104 are allowed to conduct, the capacity of the charge holding section can be increased four times.

As described above, according to the modification example of the first embodiment of the present technology, the charge holding sections 116 and the pixel connection section 104 can be connected without the holding charge control section 113. Further, an influence of on-resistance of the holding charge control section 113 can be removed.

2. Second Embodiment

According to the above-described first embodiment, the charge that has been generated by the photoelectric conversion is held by the charge holding sections of two pixels.

Further, the above charge may be held by the charge holding sections of three or more pixels. Consequently, according to a second embodiment of the present technology, the charge is held by the charge holding sections of three pixels. The second embodiment differs from the above-described first embodiment in that the number of the charge holding sections that hold the charge at the same time is three.

[Configuration of Pixel Array Section 100]

Figure 13:
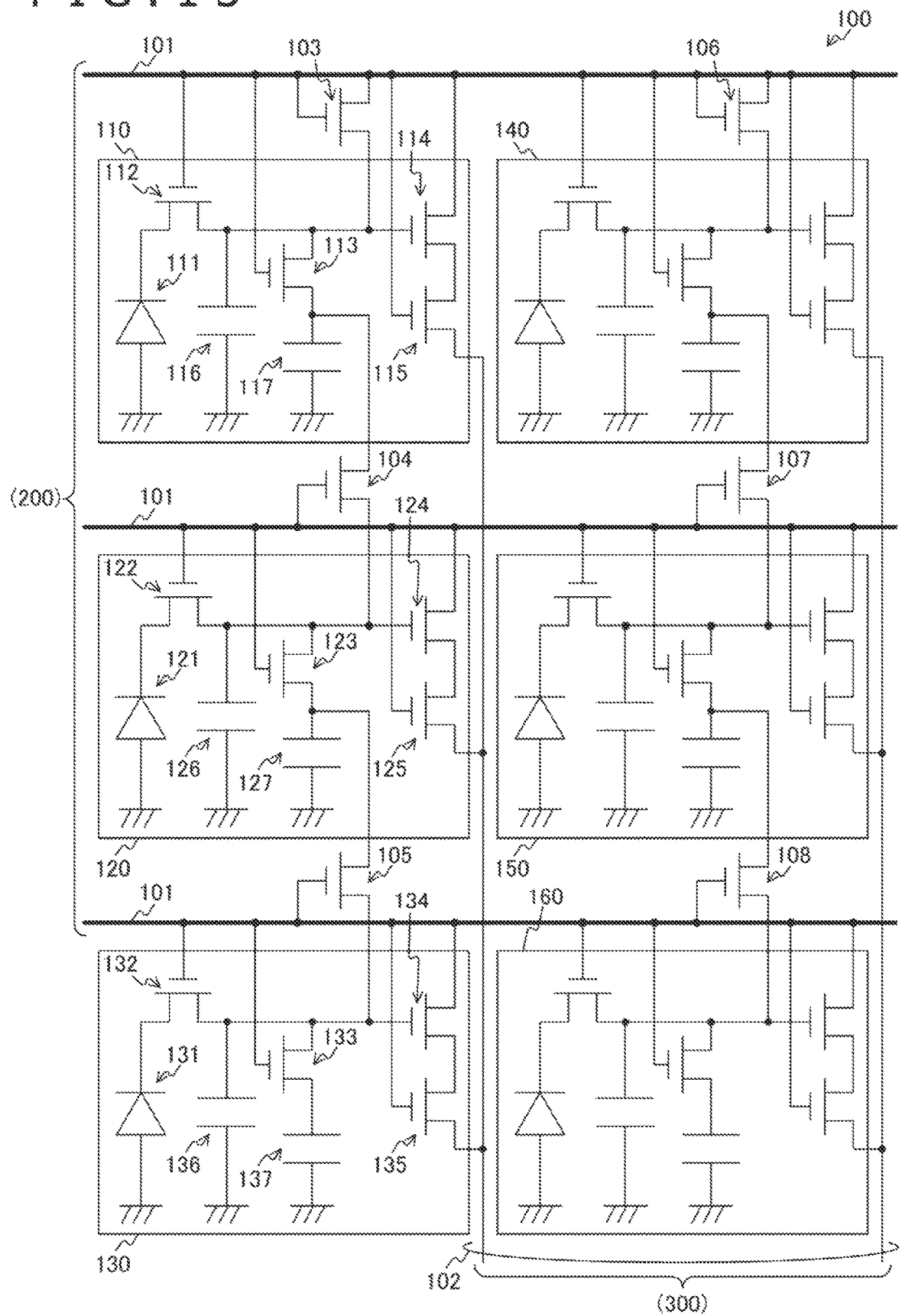
FIG. 13 is a diagram illustrating a configuration example of the pixel array section 100 according to a second embodiment of the present technology.

FIG. 13 is a diagram illustrating a configuration example of the pixel array section 100 according to the second embodiment of the present technology. The pixel array section 100 illustrated in the figure differs from the pixel array section 100 illustrated in FIG. 2 in that pixels 130 and 160 and pixel connection sections 105 and 108 are further included. The pixel 130 includes a photoelectric conversion section 131, a charge transfer section 132, a holding charge control section 133, a signal generation section 134, a selection section 135, a charge holding section 136, and a second charge holding section 137. The configuration thereof is similar to that of the pixel 110, and therefore its descriptions are omitted. Further, even in the pixel 160, the configuration thereof is similar to that of the pixel 110, and therefore its descriptions are omitted. In addition, even the pixel connection sections 105 and 108 each can have the similar configuration as that of the pixel connection section 104.

In the pixel array section 100 illustrated in the figure, the charge holding sections of three pixels are configured to be linked together by using two pixel connection sections. In this case, the capacity of the charge holding section can be changed into six stages. In the case where the capacity is increased five times, the holding charge control sections 113 and 123 and the pixel connection sections 104 and 105 are allowed to conduct at the time of allowing the charge transfer section 112 to conduct. In the case where the capacity is increased six times, the holding charge control section 113 is allowed to conduct in addition to the above. The process permits the conversion efficiency to be changed into six stages.

A configuration of the image pickup apparatus 10 other than the above is similar to that of the image pickup apparatus 10 according to the first embodiment of the present technology, and therefore its descriptions are omitted.

As described above, according to the second embodiment of the present technology, the conversion efficiency can be changed into six stages by using three pixels. Further, reduction in the image quality along with a change in the conversion efficiency can be alleviated.

3. Third Embodiment

According to the above-described first embodiment, the rolling shutter system is adopted as the image pickup system. By contrast, according to a third embodiment of the present technology, the global shutter system is adopted. The third embodiment differs from the above-described first embodiment in that the image pickup system is the global shutter system.

[Configuration of Pixel Array Section 1001]

Figure 14:
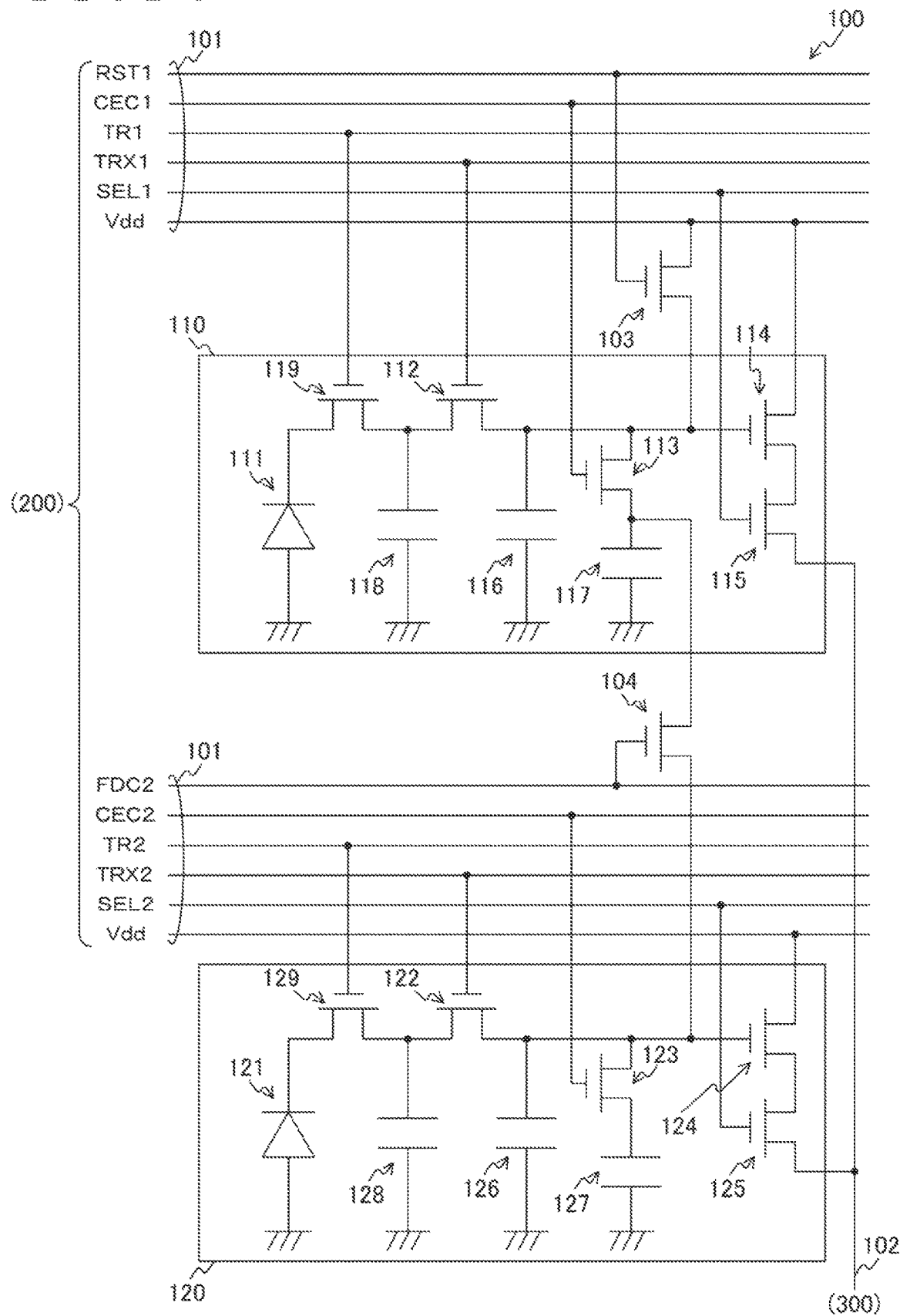
FIG. 14 is a diagram illustrating a configuration example of the pixel array section 100 according to a third embodiment of the present technology.

FIG. 14 is a diagram illustrating a configuration example of the pixel array section 100 according to the third embodiment of the present technology. The pixel 110 illustrated in the figure differs from the pixel 110 illustrated in FIG. 2 in that a second charge transfer section 119 and an auxiliary charge holding section 118 are further included. As the second charge transfer section 119, for example, an N-channel MOS transistor can be used. Further, as the auxiliary charge holding section 118, for example, an N-type semiconductor region constituting a drain electrode of the second charge transfer section 119 can be used. In addition, in the signal line 101, a transfer signal line TRX that transfers the on-signal to the second charge transfer section 119 is further arranged.

The second charge transfer section 119 is arranged between the photoelectric conversion section 111 and the charge transfer section 112. Specifically, a cathode electrode of the photoelectric conversion section 111 is connected to a source electrode of the second charge transfer section 119. A gate electrode of the second charge transfer section 119 is connected to a transfer signal line TRX1 and a drain electrode of the second charge transfer section 119 is connected to a source electrode of the charge transfer section 112 and one end of the auxiliary charge holding section 118. The other end of the auxiliary charge holding section 118 is grounded. A configuration other than the above of the pixel 110 is similar to that of the pixel 110 illustrated in FIG. 2, and therefore its descriptions are omitted.

In the similar manner as in the pixel 110, even the pixel 120 further includes a second charge transfer section 129 and an auxiliary charge holding section 128. An arrangement of the above is similar to that of the above-described pixel 110, and therefore its descriptions are omitted.

In the case of the global shutter system, an exposure is performed at the same time in all the pixels that are arranged in the pixel array section 100. Then, an output of the image signal is sequentially performed in each line. As a matter of convenience, it is assumed that the CDS is not performed and specific processing will be described. After a predetermined exposure period has elapsed, the on-signal is input into the pixel reset section 103, the charge transfer sections 112 and 122, the holding charge control section 113, and the pixel connection section 104, and then the above sections conduct. Through the process, the charge holding sections 116 and 126 and the auxiliary charge holding sections 118 and 128 are reset. After the reset, an input of the on-signal into the pixel reset section 103 etc. is stopped.

Next, the on-signal is input into the second charge transfer sections 119 and 129, and then the above sections conduct. Through the process, charges that have been held by the photoelectric conversion sections 111 and 121 are transferred to the auxiliary charge holding sections 118 and 128, respectively. After the charges are transferred, an input of the on-signal into the second charge transfer sections 119 and 129 is stopped. Further, a new exposure period is started on the basis of the above and the photoelectric conversion sections 111 and 121 start holding the generated charge.

Next, the on-signal is input into the charge transfer section 112 and then the charge transfer section 112 conducts. Through the process, the charge that has been held by the auxiliary charge holding section 118 is transferred to the charge holding section 116. On the occasion, the holding charge control section 113 and the pixel connection section 104 are allowed to conduct to thereby triple the capacity of the charge holding section. Further, the image signal is generated by the signal generation section 114 and is output via the selection section 115. After an input of the on-signal into the charge transfer section 112 is stopped, the on-signal is input into the charge transfer section 122 and then the charge transfer section 122 conducts. Through the process, the charge that has been held by the auxiliary charge holding section 128 is transferred to the charge holding section 126. On the occasion, the holding charge control section 113 and the pixel connection section 104 are allowed to conduct to thereby triple the capacity of the charge holding section. Further, the image signal is generated by the signal generation section 124 and is output via the selection section 125.

As described above, in accordance with the global shutter system, in all the pixels that are arranged in the pixel array section 100, the charge that has been generated by the photoelectric conversion section 111 etc. is transferred to the auxiliary charge holding section 118 etc. at the same time. Through the process, the exposure can be performed at the same time in all the pixels that are arranged in the pixel array section 100. A distortion of the image can be reduced as compared with the rolling shutter system.

A configuration of the image pickup apparatus 10 other than the above sections is similar to that of the image pickup apparatus 10 according to the first embodiment of the present technology, and therefore its descriptions are omitted.

As described above, according to the third embodiment of the present technology, the image is taken by using the global shutter system to thereby reduce a distortion of the image.

4. Fourth Embodiment

According to the above-described first embodiment, one photoelectric conversion section is arranged in the pixel. By contrast, according to a fourth embodiment of the present technology, a plurality of photoelectric conversion sections are arranged in the pixel. The fourth embodiment differs from the above-described first embodiment in that the plurality of photoelectric conversion sections are arranged and the charge holding section is shared by them.

[Configuration of Pixel Array Section 100]

Figure 15:
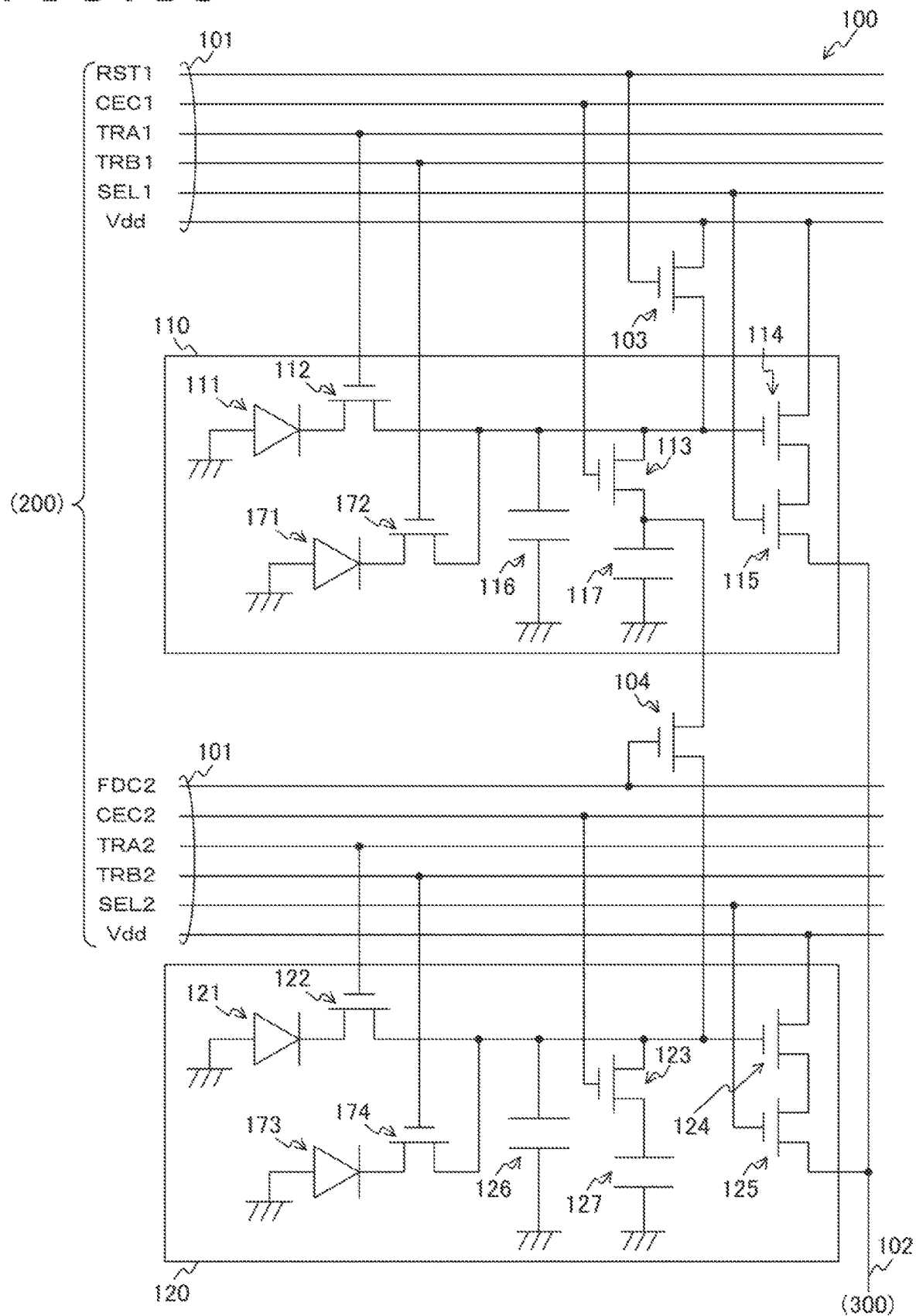
FIG. 15 is a diagram illustrating a configuration example of the pixel array section 100 according to a fourth embodiment of the present technology.

FIG. 15 is a diagram illustrating a configuration example of the pixel array section 100 according to the fourth embodiment of the present technology. The pixel 110 illustrated in the figure differs from the pixel 110 illustrated in FIG. 2 in that the photoelectric conversion section 171 and the charge transfer section 172 are further included. In addition, in the signal line 101, transfer signal lines TRA and TRB that transfer the on-signal to the charge transfer sections 112 and 172, respectively, are arranged in place of the transfer signal line TR.

A cathode electrode of the photoelectric conversion section 171 is connected to a source electrode of the charge transfer section 172 and an anode electrode thereof is grounded. Gate electrodes of the charge transfer sections 112 and 172 are connected to transfer signal lines TRA1 and TRB2, respectively. Drain electrodes of the charge transfer sections 112 and 172 are connected to one end of the charge holding section 116 in common. A configuration of the pixel 110 other than the above sections is similar to that of the pixel 110 illustrated in FIG. 2, and therefore its descriptions are omitted.

In the similar manner as in the pixel 110, even the pixel 120 further includes the photoelectric conversion section 173 and the charge transfer section 174. An arrangement of the above sections in the pixel 120 is similar to that of the above sections in the above-described pixel 110, and therefore its descriptions are omitted.

The pixel 110 illustrated in the figure has a configuration in which the charge holding section 116 and the signal generation section 114 are shared by the photoelectric conversion section 111 and the charge transfer section 112 as well as the photoelectric conversion section 171 and the charge transfer section 172. Further, the processing is carried out by using the rolling shutter system. Specifically, after a predetermined exposure period has elapsed, the charge holding section 116 is reset. Further, the charge transfer section 112 conducts and the charge that has been generated by the photoelectric conversion section 111 is transferred to the charge holding section 116. The image signal is generated by the signal generation section 114 and is output via the selection section 115, and then the charge holding section 116 is reset again. Next, the charge transfer section 172 conducts and the charge that has been generated by the photoelectric conversion section 171 is transferred to the charge holding section 116. Further, the image signal is generated by the signal generation section 114 and is output via the selection section 115. Note that the charge transfer sections 112 and 172 conduct and the charges that has been generated by the photoelectric conversion sections 111 and 171 are held by the charge holding section 116. On the occasion, the holding charge control section 113 and the pixel connection section 104 are allowed to conduct to thereby triple the capacity of the charge holding section.

Processing in the pixel 120 is similar to that in the pixel 110, and therefore its descriptions are omitted. As described above, the plurality of photoelectric conversion sections are arranged in one pixel, and at the same time the charge holding section etc. are shared. Through the process, a configuration of the pixel array section 100 can be simplified.

A configuration of the image pickup apparatus 10 other than the above is similar to that of the image pickup apparatus 10 according to the first embodiment of the present technology, and therefore its descriptions are omitted.

As described above, according to the fourth embodiment of the present technology, even in the case where the pixel including the plurality of photoelectric conversion sections is used, a change in the conversion efficiency can be performed.

As described above, in the embodiment of the present technology, the charge holding sections that each are arranged in the plurality of pixels are connected. Further, the charge that has been generated by one photoelectric conversion section is by the charge holding sections 116 and 126. Through the process, the conversion efficiency can be switched while preventing an increase in an area of the pixel and further a dynamic range the pixel can be enlarged.

The above-described embodiments are examples for embodying the present technology and matters in the embodiments each have a corresponding relationship with disclosure-specific matters in the claims. Similarly, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences an recording medium storing the program. As the recording medium, for example, a CD (Compact Disc), an MD (Mini-Disc), a DVD (Digital Versatile Disc), a memory card, and a Blu-ray disc (registered trademark) can be used.

In addition, the effects described in the present specification are not limiting but are merely examples, and there may be other effects.

Additionally, the present technology may also be configured as below.

(1) A solid-state image pickup device including:
a plurality of pixels each including a photoelectric conversion section that generates a charge according to irradiated light, a charge holding section that holds the generated charge, and a signal generation section that generates as an image signal a signal according to the held charge;
a pixel connection section that conducts between a plurality of the charge holding sections of the plurality of pixels and thereby allows each of the charge holding sections of the plurality of pixels to hold the charge that has been generated by the photoelectric conversion section of one of the plurality of pixels; and
a pixel reset section that discharges and resets the charge of the respective charge holding sections of the plurality of pixels when the pixel connection section conducts between the respective charge holding sections of the plurality of pixels.

(2) The solid-state image pickup device according to (1), in which
the plurality of pixels each further include a second charge holding section that holds the generated charge and a holding charge control section that conducts between the charge holding section and the second charge holding section and thereby allows the charge holding section and the second charge holding section to hold the generated charge.

(3) The solid-state image pickup device according to (2), in which
the holding charge control section conducts between the charge holding section and the second charge holding section and thereby discharges a charge of the second charge holding section when a charge of the charge holding section is discharged by the pixel reset section.

(4) The solid-state image pickup device according to any one of (1) to (3), in which
the pixel connection section and the pixel reset section are each configured by a MOS transistor having substantially the same shape.

(5) The solid-state image pickup device according to any one of (1) to (4), in which
the pixel reset section is connected to the charge holding section of one of the plurality of pixels, and
the pixel connection section is arranged near to other of the plurality of pixels than the one pixel to which the pixel reset section is connected and simultaneously the other pixel and the pixel connection section are formed to have substantially the same shapes as those of the one pixel to which the pixel reset section is connected and the pixel reset section.

(6) The solid-state image pickup device according to any one of (1) to (5), in which
the pixel connection section conducts between the charge holding sections of adjacent pixels among the plurality of pixels.

(7) The solid-state image pickup device according to (1) to (6), in which
the plurality of pixels each further include an auxiliary charge holding section that holds the generated charge and the charge holding section holds the charge that has been held by the auxiliary charge holding section.

(8) The solid-state image pickup device according to (1) to (6), in which
the plurality of pixels include a plurality of the photoelectric conversion sections and the charge holding sections hold a charge that has been generated by one of the plurality of photoelectric conversion sections.

(9) A solid-state image pickup device including:
a plurality of pixels each including a photoelectric conversion section that generates a charge according to irradiated light, a charge holding section that holds the generated charge, and a signal generation section that generates as an image signal a signal according to the held charge;
a plurality of pixel connection sections that conduct between a plurality of the charge holding sections of two pixels of the plurality of pixels and thereby allow each of the charge holding sections of the two pixels to hold the charge that has been generated by the photoelectric conversion section of one pixel of the two pixels; and
a pixel reset section that discharges and resets the charge of the respective charge holding sections of the plurality of pixels when the plurality of pixel connection sections conduct between the respective charge holding sections of the plurality of pixels.

(10) An image pickup apparatus including:
a plurality of pixels each including a photoelectric conversion section that generates a charge according to irradiated light, a charge holding section that holds the generated charge, and a signal generation section that generates as an image signal a signal according to the held charge;
a pixel connection section that conducts between a plurality of the charge holding sections of the plurality of pixels and thereby allows each of the charge holding sections of the plurality of pixels to hold the charge that has been generated by the photoelectric conversion section of one pixel of the plurality of pixels;
a pixel reset section that discharges and resets the charge of the respective charge holding sections of the plurality of pixels when the pixel connection section conducts between the respective charge holding sections of the plurality of pixels; and
a processing circuit that processes the generated image signal.

REFERENCE SIGNS LIST

10 Image pickup apparatus
100 Pixel Array section
103, 106 Pixel reset section
104, 105, 107, 108 Pixel connection section
110, 120, 130, 140, 150, 160 Pixel
111, 121, 131, 171, 173 Photoelectric conversion section
112, 122, 132, 172, 174 Charge transfer section
113, 123, 133 Holding charge control section
114, 124, 134 Signal generation section
115, 125, 135 Selection section
116, 126, 136 Charge holding section
117, 127, 137 Second charge holding section
118, 128 Auxiliary charge holding section
119, 129 Second charge transfer section
200 Vertical drive section
300 Horizontal drive section
301 Voltage supply
302 ROS transistor
320 CDS section
330 Horizontal transfer section
400 AGC section
500 ADC section
600 Control section

What is claimed is:
1. A light detecting device, comprising:
a first pixel including:
a first photoelectric conversion region;

a first charge holding region coupled to the first photoelectric conversion region via a first transfer transistor;
an amplification transistor;
a first wiring directly connected between the first charge holding region and a gate electrode of the amplification transistor; and
a first switch transistor configured to couple the first charge holding region to a second charge holding region;
a second pixel including:
a second photoelectric conversion region; and
a third charge holding region coupled to the second photoelectric conversion region via a second transfer transistor; and
a pixel connection circuit coupled to the second charge holding region and the third charge holding region.

2. The light detecting device of claim 1, wherein
the second pixel further includes a second switch transistor configured to couple the third charge holding region to a fourth charge holding region.

3. The light detecting device of claim 1, wherein
the pixel connection circuit includes a transistor.

4. The light detecting device of claim 1, wherein
the first and second pixels are in a same column of a pixel array.

5. The light detecting device of claim 1, wherein
a conversion efficiency of the first and second pixels is changeable in multiple-stages.

6. The light detecting device of claim 1, wherein
the first and second pixels output a pixel signal via a same signal line.

7. The light detecting device of claim 1, wherein
the second charge holding region is included in the first pixel.

8. The light detecting device of claim 1, wherein
the first pixel further comprises a selection transistor coupled to the amplification transistor.

9. The light detecting device of claim 8, wherein
a drain of the amplification transistor is coupled to a power source, and a source of the amplification transistor is coupled to the selection transistor.

10. The light detecting device of claim 2, further comprising:
a third pixel including:
a third photoelectric conversion region; and
a fifth charge holding region; and
a second pixel connection circuit configured to couple the fourth charge holding region to the fifth charge holding region.

11. The light detecting device of claim 10, wherein
the first, second and third pixels are in a same column of a pixel array.

12. The light detecting device of claim 1, wherein
a reset transistor coupled to the first charge holding region is configured to discharge a charge held by the first and second charge holding regions by turning on the first switch transistor.

13. The light detecting device of claim 12, wherein
the reset transistor is configured to discharge a charge held by the third charge holding region by turning on the pixel connection circuit.

14. The light detecting device of claim 1, wherein
the second pixel does not include a reset transistor.

15. A light detecting apparatus, comprising:
the light detecting device according to claim 1; and
a processing circuit that processes an image signal generated from the light detecting device.

* * * * *